(12) United States Patent
Manfrini et al.

(10) Patent No.: US 12,191,389 B2
(45) Date of Patent: Jan. 7, 2025

(54) LAYERED STRUCTURE, SEMICONDUCTOR DEVICE INCLUDING THE SAME, AND MANUFACTURING METHOD THEREOF

(71) Applicant: Taiwan Semiconductor Manufacturing Company, Ltd., Hsinchu (TW)

(72) Inventors: Mauricio Manfrini, Hsinchu County (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/953,278

(22) Filed: Nov. 19, 2020

(65) Prior Publication Data

US 2021/0391470 A1 Dec. 16, 2021

Related U.S. Application Data

(60) Provisional application No. 63/038,909, filed on Jun. 15, 2020.

(51) Int. Cl.
*H01L 29/78* (2006.01)
*H01L 21/28* (2006.01)
*H01L 29/66* (2006.01)

(52) U.S. Cl.
CPC ............ *H01L 29/78391* (2014.09); *H01L 29/40111* (2019.08); *H01L 29/6656* (2013.01)

(58) Field of Classification Search
CPC ........... H01F 10/3263; H01L 29/78391; H01L 29/40111
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,053,802 B2* | 6/2015 | Muller | G11C 11/2275 |

(Continued)

FOREIGN PATENT DOCUMENTS

CN 1327531 C * 7/2007

OTHER PUBLICATIONS

Tutorialspoint, https://web.archive.org/web/20160418150028/https://www.tutorialspoint.com/vlsi_design/ vlsi_design_mos_transistor.htm, Apr. 18, 2016 (Year: 2016).*

(Continued)

*Primary Examiner* — Vincent Wall
(74) *Attorney, Agent, or Firm* — JCIPRNET

(57) ABSTRACT

A semiconductor device includes a transistor and a ferroelectric tunnel junction. The ferroelectric tunnel junction is connected to a drain contact of the transistor. The ferroelectric tunnel junction includes a first electrode, a second electrode, a crystalline oxide layer, and a ferroelectric layer. The second electrode is disposed over the first electrode. The crystalline oxide layer and the ferroelectric layer are disposed in direct contact with each other in between the first electrode and the second electrode. The crystalline oxide layer comprises a crystalline oxide material. The ferroelectric layer comprises a ferroelectric material.

20 Claims, 24 Drawing Sheets

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,727,276 B1* | 7/2020 | Lien | H10N 50/80 |
| 2003/0085375 A1* | 5/2003 | Schubring | H01F 1/00 |
| | | | 252/62.51 C |
| 2005/0122005 A1* | 6/2005 | Higuchi | B41J 2/1629 |
| | | | 257/E21.272 |
| 2006/0049440 A1* | 3/2006 | Bruchhaus | H01L 27/11502 |
| | | | 257/295 |
| 2007/0152921 A1* | 7/2007 | Osame | G09G 3/3258 |
| | | | 345/76 |
| 2009/0140306 A1* | 6/2009 | Ando | H10B 53/00 |
| | | | 257/295 |
| 2012/0281462 A1* | 11/2012 | Bessho | H01L 43/08 |
| | | | 365/158 |
| 2012/0313103 A1* | 12/2012 | Yamada | H01L 29/78633 |
| | | | 257/292 |
| 2019/0157210 A1* | 5/2019 | May | H01L 23/522 |
| 2019/0273119 A1* | 9/2019 | Zhou | H01L 27/228 |

OTHER PUBLICATIONS

Lairson et al., "Epitaxial Pt(110), and Pt(111) Films on MgO(001), MgO(110), MgO(111), and Al.sub.2O.sub.3(0001)," Appl. Phys. Lett. 61(12):1390-1392 (Year: 1992).*

The Materials Project, https://next-gen.materialsproject.org/materials/mp-1224984 ("Project") (Year: 2023).*

K. Ni, et al., "SoC Logic Compatible Multi-Bit FeMFET Weight Cell for Neuromorphic Applications", 2018 IEEE International Electron Devices Meeting (IEDM), Dec. 2018, pp. 13.2.1-13.2.4.

* cited by examiner

LAYERED STRUCTURE, SEMICONDUCTOR DEVICE INCLUDING THE SAME, AND MANUFACTURING METHOD THEREOF

CROSS-REFERENCE

This application claims the priority benefit of U.S. provisional application Ser. No. 63/038,909, filed on Jun. 15, 2020. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2I are schematic cross-sectional views of structures formed during a manufacturing process of a semiconductor device in accordance with some embodiments of the disclosure.

DETAILED DESCRIPTION

Figure 1A:
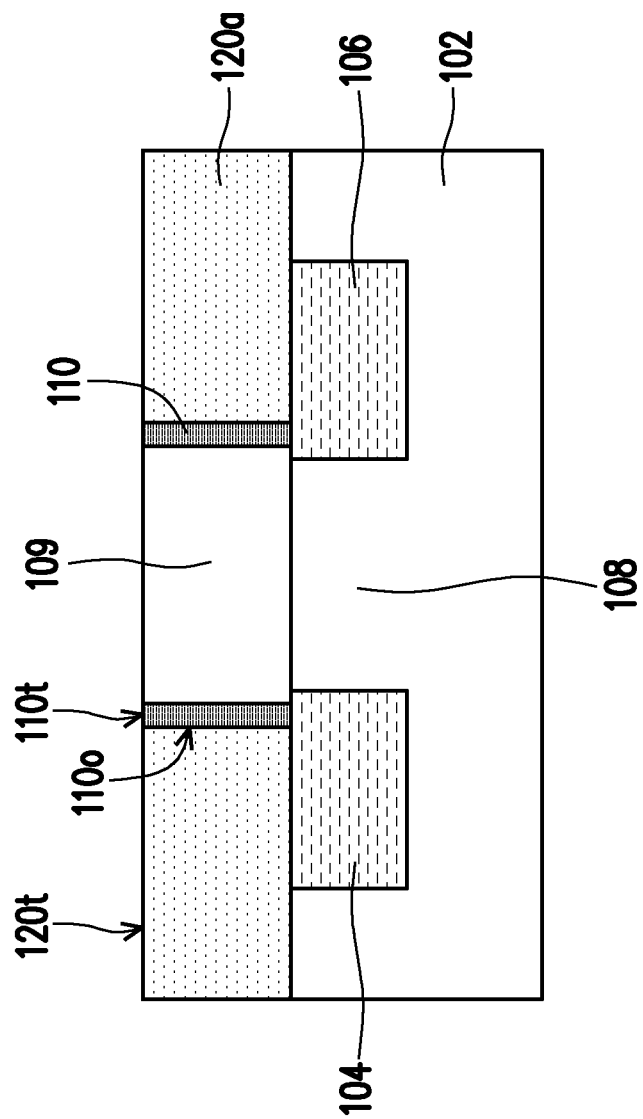
FIG. 1A to FIG. 1G are schematic cross-sectional views of structures formed during a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 1G are schematic cross-sectional views illustrating structures produced during a manufacturing process of a semiconductor device 100 according to some embodiments of the disclosure. Referring to FIG. 1A, a semiconductor substrate 102 is provided. In some embodiments, the semiconductor substrate 102 includes one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 102 may be a semiconductor-on-insulator, including at least one layer of dielectric material (e.g., an oxide layer) disposed between a pair of semiconductor layers (e.g., silicon layers). The semiconductor substrate 102 may include various doped regions 104, 106 depending on circuit requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type field-effect transistor, or alternatively, configured for a p-type field-effect transistor. In some embodiments, the doped regions 104, 106 may be used as source and drain regions of the later formed transistors. In some embodiments, pairs of source and drain regions 104, 106 may be separated by channel regions 108 of semiconductor material. In some embodiments, a material of the source and drain regions 104, 106 may differ from the material of the channel region 108, in terms of the chemical identity of the substrate material and/or dopant concentration. In some embodiments, three-dimensional structures (e.g., fins, slabs, etc.) may be formed in and/or on the semiconductor substrate 102, and the source and drain regions 104, 106 and the channel regions 108 may be formed in and/or on such three-dimensional structures. For example, portions of the semiconductor substrate 102 may be removed to define fins protruding from the semiconductor substrate 102, and portions of the fins may be doped or replaced with strained material to form the source and drain regions 104, 106. In some embodiments, the material within the source and drain regions 104, 106 may be disposed as a single-layered structure or a multi-layered structure, with different layers having different degrees of doping. In some embodiments, isolation structures (not shown) are formed in the semiconductor substrate 102. The isolation structures may be formed by filling trenches with a dielectric material, or by locally oxidizing the semiconductor material of the semiconductor substrate 102.

In some embodiments, a sacrificial gate 109 is formed on the channel region 108. In some embodiments, the sacrificial gate 109 may include polysilicon, and may define the location of the subsequently formed gate structure 130 (illustrated, e.g., in FIG. 1G). In some embodiments, spacers 110 are formed over the semiconductor substrate 102 at the sides of the sacrificial gate 109. In some embodiments, the spacers 110 extend over the semiconductor substrate 102 forming one or more ring structures. In some alternative embodiments, the spacers 110 extend at opposite sides of the sacrificial gate 109, without forming the ring structure. In some embodiments, the spacers 110 are formed of dielectric materials, such as silicon oxide, silicon nitride, carbonized silicon nitride (SiCN), SiCON, or a combination thereof. In some embodiments, the spacers 110 are monolayered structures. In some alternative embodiments, the spacers 110 are multilayered structures.

Figure 1B:
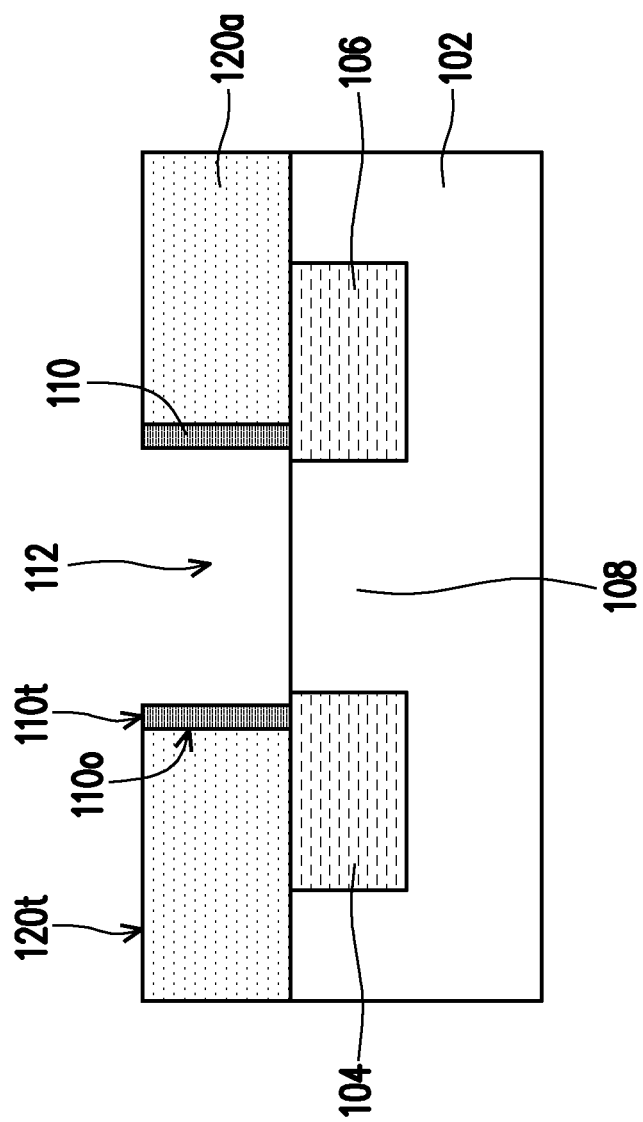

In some embodiments, the sacrificial gate 109 may be removed, resulting in formation of an enclosure 112 delimited at its sides by the spacers 110, as illustrated, e.g., in FIG. 1B. That is, upon removal of the sacrificial gate 109, pairs of parallel spacers 110 may delimit enclosures 112 exposing one or more channel regions 108 at their bottom. In some embodiments, a pair of parallel spacers 110 is connected at opposite line-ends and forms the ring structure or a wall structure defining the enclosure 112 in which one or more channel regions 108, and, possibly, isolation structures are exposed. In some embodiments, the source and drain regions 104, 106 may be located along the edges of the enclosures 112 defined by the spacers 110.

In some embodiments, an interlayer dielectric material layer 120a is disposed over the semiconductor substrate 102, surrounding the spacers 110 and the enclosure 112. In other words, the interlayer dielectric material layer 120a is formed adjacent to the spacers 110, outside of the spacers 110 and outside the enclosure 112. In some embodiments, a material of the interlayer dielectric material layer 120a includes low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. It is understood that the interlayer dielectric material layer 120a may include one or more dielectric materials or one or more dielectric layers. In some embodiments, the interlayer dielectric material layer 120a is formed to a suitable thickness by flowable CVD (FCVD), CVD, HDPCVD, SACVD, spin-on, sputtering, or other suitable methods. For example, an interlayer dielectric precursor layer (not shown) may be initially formed to cover the spacers 110, and the temporary dummy gate (not shown) formed in between the spacers 110. Subsequently, a thickness of the interlayer dielectric precursor layer is reduced until top surfaces 110t of the spacers 110 are exposed, so as to form the interlayer dielectric material layer 120a. The thickness of the interlayer dielectric precursor layer may be adjusted via a chemical mechanical polishing (CMP) process, an etching process, or other suitable processes. The interlayer dielectric material layer 120a faces outer sidewalls 110o of the spacers 110, so that within the enclosure 112 delimited by the spacers 110 the isolation structures (not shown) and the channel regions 108 are exposed. In some embodiments, portions of the spacers 110 (and of the temporary dummy gate disposed in between) may also be removed when removing material from the interlayer dielectric precursor layer to form the interlayer dielectric material layer 120a, so that top surfaces 110t of the spacers 110 are substantially coplanar with the top surface 120t of the interlayer dielectric material layer 120a.

Figure 1C:
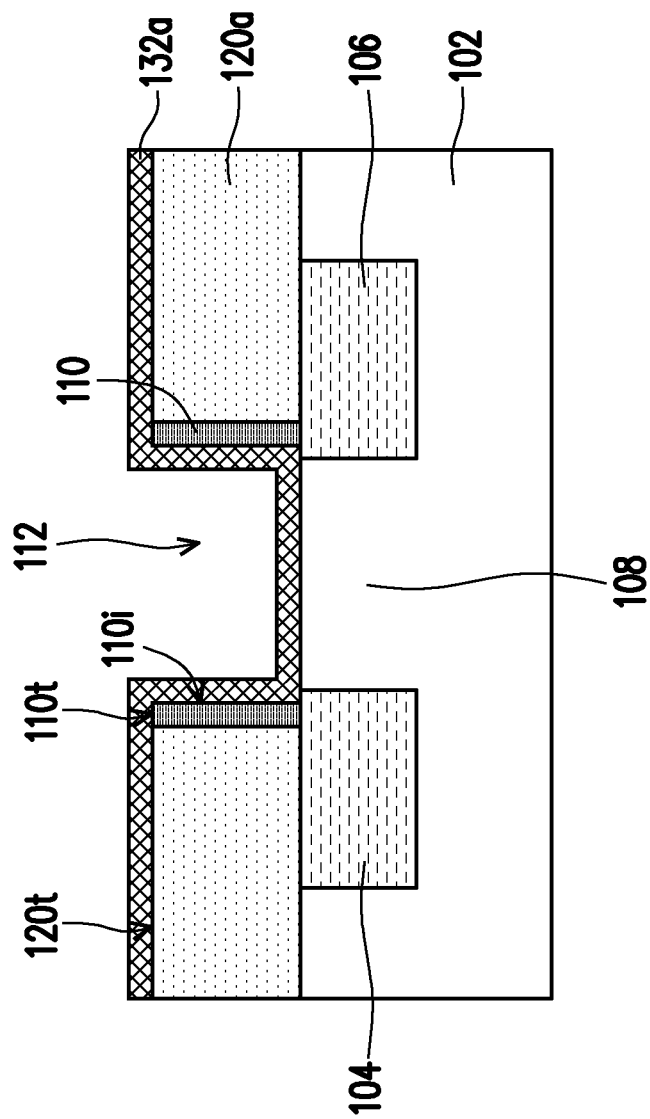

Referring to FIG. 1C, in some embodiments, a crystalline oxide blanket layer 132a may be conformally formed over the substrate 102. The crystalline oxide blanket layer 132a may be initially formed to extend on the top surface 120t of the interlayer dielectric material layer 120a, the top surfaces 110t of the spacers 110, on the inner sidewalls 110i of the spacers 110 within the enclosure 112, and on the channel region 108 and the isolation structures (not shown) at the bottom of the enclosure 112 in between the spacers 110. In some embodiments, the crystalline oxide blanket layer 132a includes a crystalline oxide material having a crystalline or polycrystalline structure. In some embodiments, the crystalline oxide material presents three-dimensional order on the level of atomic dimensions, with the atoms or ions forming the crystalline oxide material being arranged according to one or more crystal structures. That is, the crystalline oxide material is not an amorphous material. In some embodiments, the crystalline oxide material constitutes the majority (e.g., at least 80% by weight) of the crystalline oxide blanket layer 132a, so that the crystalline oxide blanket layer 132a has a highly ordered structure. In some embodiments, the crystalline oxide blanket layer 132a may include up to 20% of non-crystalline material. In some alternative embodiments, the crystalline oxide blanket layer 132a consists of the crystalline oxide material. Crystal oxides that may be selected for the crystalline oxide material are not particularly limited. In some embodiments, the crystalline oxide material may be at least one crystal oxide selected from magnesium oxide, aluminum oxide, tantalum oxide, other suitable crystal oxides, and/or a combination thereof. A method of forming the crystalline oxide blanket layer 132a is not particularly limited, and may be selected according to the crystalline oxide material selected for the crystalline oxide blanket layer 132a. For example, forming the crystalline oxide blanket layer 132a may include performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like. In some embodiments, the crystalline oxide material of the crystalline oxide blanket layer 132a may be deposited with an amorphous structure, and may be treated to become crystalline. For example, the amorphous oxide material may be treated thermally, with crystalline dopants, or a combination of crystalline dopants and heat, to form the crystalline oxide material having a crystalline structure. In some alternative embodiments, the crystalline oxide material may be deposited directly in a polycrystalline form, for example via PVD. In some embodiments, the crystallinity may be further enhanced through thermal treatment, dopant treatment, or a combination of the two. In some still alternative embodiments, the crystalline oxide material may form a single crystal as deposited, for example via molecular beam epitaxy (MBE). In some embodiments, for polycrystalline materials, the deposition conditions may be tuned so as to enhance a specific crystal orientation. For example, when magnesium oxide is selected as crystalline oxide material, it may be deposited with different orientations of its crystal lattice. In FIG. 1H to FIG. 1J are respectively illustrated the crystal lattice orientations (001), (110) and (111) of magnesium oxide. In some embodiments, the deposition conditions may be adapted so that a preferred orientation or phase of the crystalline oxide is preferentially formed. For example, when the crystalline oxide includes magnesium oxide, the deposition conditions may be selected so that one of the orientations of the crystalline lattice illustrated in FIG. 1H to FIG. 1J is preferentially formed. This, in turn, may facilitate obtaining the preferred phase of a ferroelectric material (e.g., orthorhombic phase for hafnium zirconium oxide, etc.) which is later deposited on the crystalline oxide, with the crystalline oxide acting as a template during growth of the ferroelectric material.

Figure 1D:
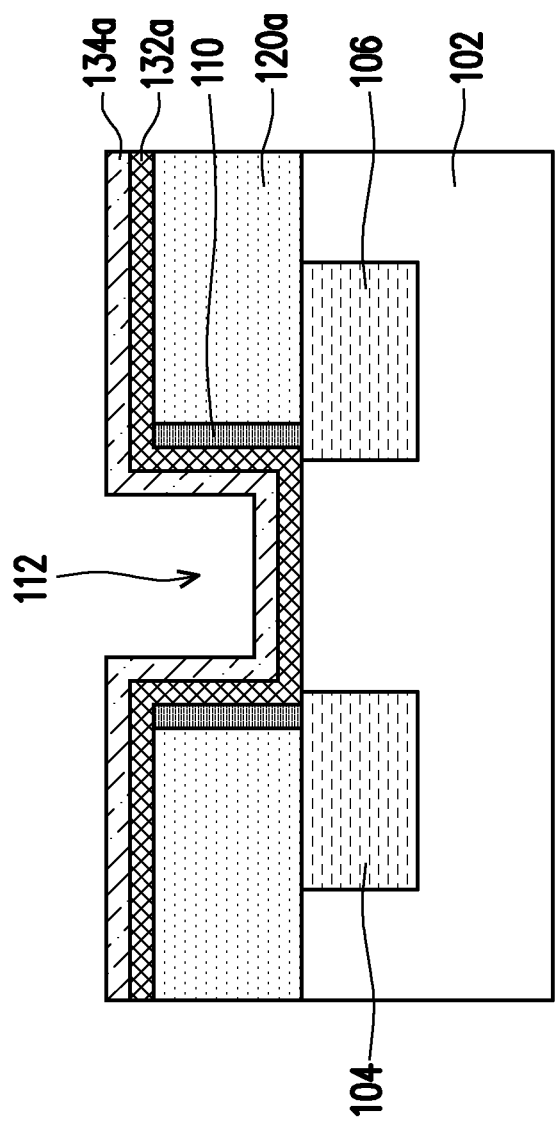

In some embodiments, as illustrated in FIG. 1D, a ferroelectric blanket layer 134a is formed on the crystalline oxide blanket layer 132a. The ferroelectric blanket layer 134a may initially extend on the crystalline oxide blanket layer 132a within and out of the enclosure 112, over the spacers 110 and the interlayer dielectric material layer 120a. In some embodiments, the ferroelectric blanket layer 134a includes a ferroelectric material. For example, the ferroelectric blanket layer 134a may include one or more of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_2$(BLT), $LaNiO_3$ (LNO), $YMnO_3$, $ZrO_2$, zirconium silicate, ZrAlSiO, $HfO_2$, hafnium zirconium oxide, zinc oxide, aluminum nitride, aluminum scandium nitride, hafnium silicate, HfAlO, LaAlO, and lanthanum oxide. In some embodiments, the ferroelectric material comprises at least one ferroelectric oxide selected from hafnium oxide, hafnium zirconium oxide, hafnium lanthanum oxide, hafnium aluminum oxide, and hafnium silicon oxide. The ferroelectric blanket layer 134a may be formed by any suitable technique, for example CVD, metal oxide chemical vapor deposition (MOCVD), ALD, chemical-solution deposition (CSD), physical vapor deposition (PVD), or the like.

Figure 1E:
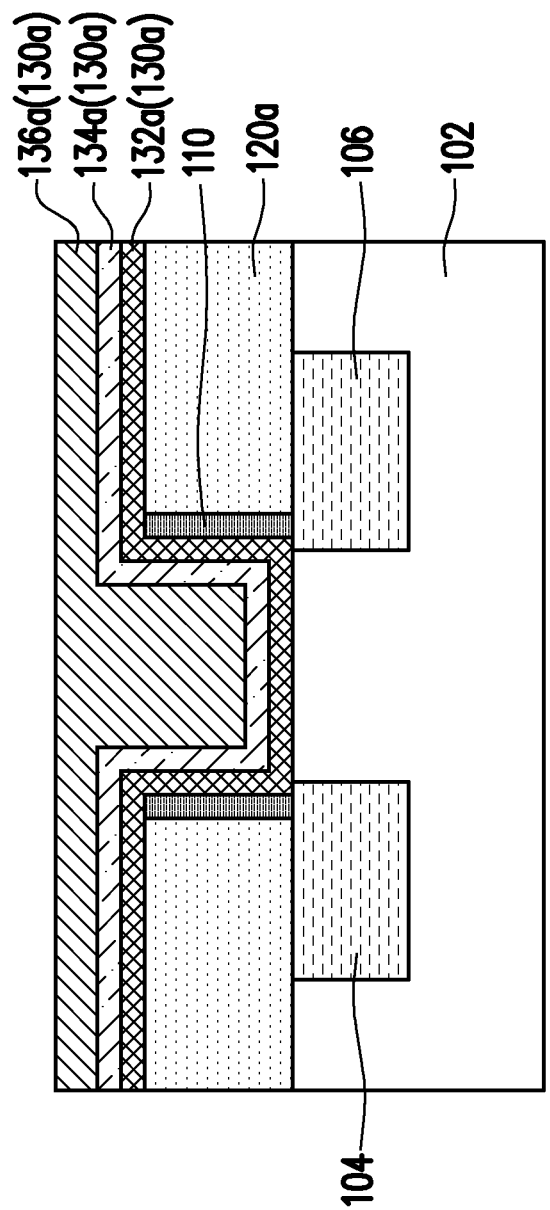

Referring to FIG. 1E, in some embodiments a gate metal blanket layer 136a is formed on the ferroelectric blanket layer 134a. In some embodiments, the gate metal blanket layer 136a fills the enclosure 112 (illustrated, e.g., in FIG. 1D), and further extends over the spacers 110 and the interlayer dielectric material layer 120a. In some embodiments, the gate metal blanket layer 136a may include a work function material and a gate electrode material. In some embodiments, the work function material and the gate electrode material are sequentially deposited over the ferroelectric blanket layer 134a. In some embodiments, the work function material may be selected according to the conductivity type desired for the transistor to adjust a threshold voltage of the transistor. For example, p-type work function materials include TIN, TaN, Ru, Mo, Al, WN, $ZrSi_2$, $MoSi_2$, $TaSi_2$, $NiSi_2$, other suitable p-type work function materials, or combinations thereof. On the other hand, n-type work function materials include, for example, Ti, Ag, TaAl, TaAlC, TiAlN, TaC, TaCN, TaSIN, Mn, Zr, other suitable n-type work function materials, or combinations thereof. In some embodiments, the method of providing the work function material includes performing at least one suitable deposition technique, such as CVD, PECVD, ALD, RPALD, PEALD, MBD, or the like. In some embodiments, the gate electrode material includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the crystalline oxide blanket layer 132a, the ferroelectric blanket layer 134a, and the gate metal blanket layer 136a may be collectively referred to as a gate blanket structure 130a. In some embodiments, the gate blanket structure 130a may include additional layers such as barrier layers, liner layers, interface layers, seed layers, adhesion layers, etc.

Figure 1F:
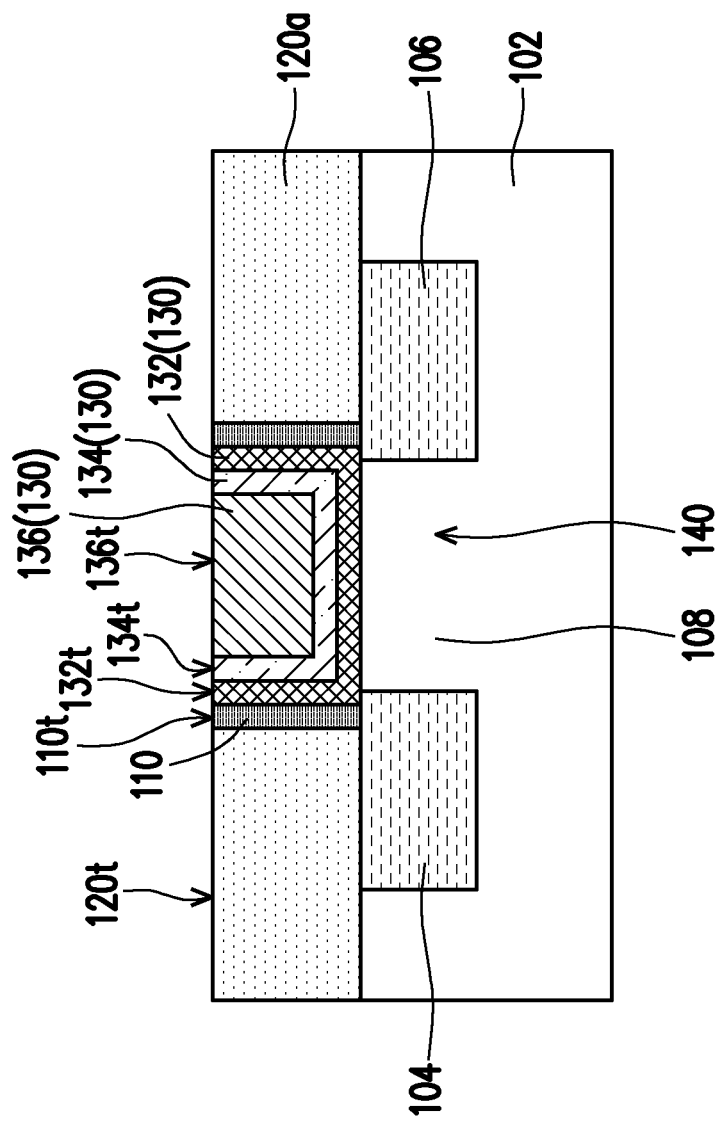

Referring to FIG. 1E and FIG. 1F, a planarization process may be performed in which portions of the gate blanket structure 130a are removed until the top surfaces 110t of the spacers 110 and the top surface 120t of the interlayer dielectric material layer 120a are exposed. To this end, a chemical mechanical polishing (CMP) process or an etching process may be performed. In some embodiments, the portions of the crystalline oxide blanket layer 132a, the ferroelectric blanket layer 134a and the gate metal blanket layer 136a extending over the interlayer dielectric material layer 120a are removed, thus forming the gate structure 130 of the front-end-of-line transistor 140. Following the planarization process, the top surfaces 110t of the spacers 110 may be substantially coplanar with the top surface 120t of the interlayer dielectric material layer 120a, with the top surface 132t of the portions of the crystalline oxide layer 132 extending on the spacers 110, with the top surface 134t of the ferroelectric layer 134, and with the top surface 136t of the gate metal layer 136.

Figure 1G:
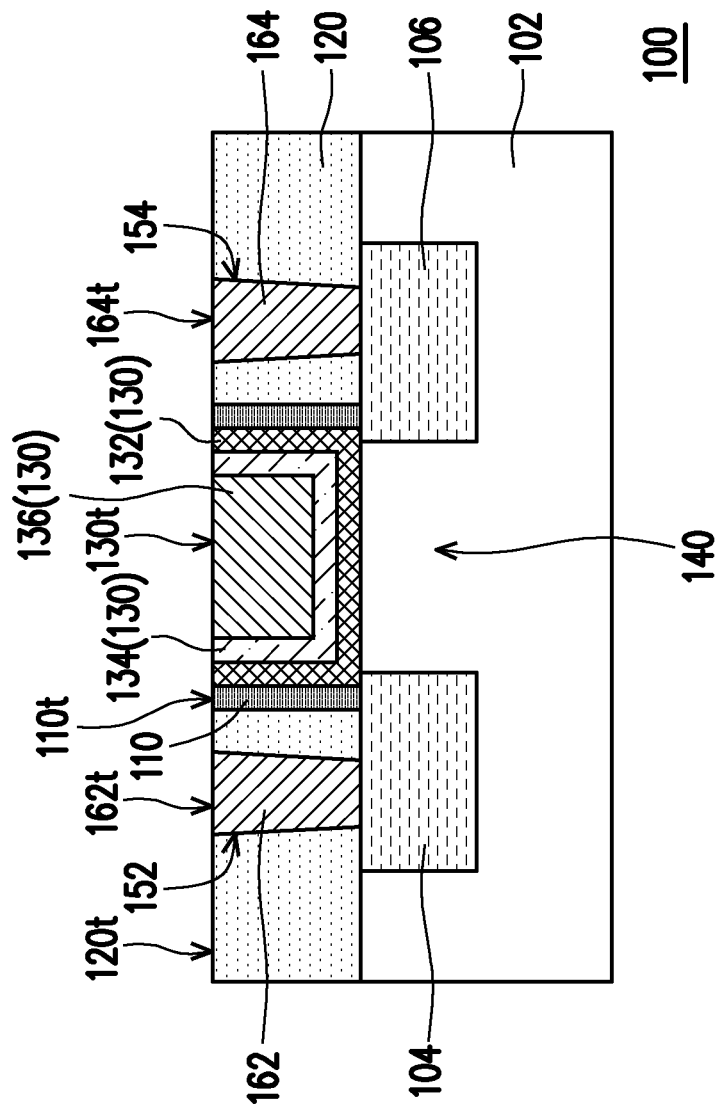
Figures 1H, 1I, 1J:
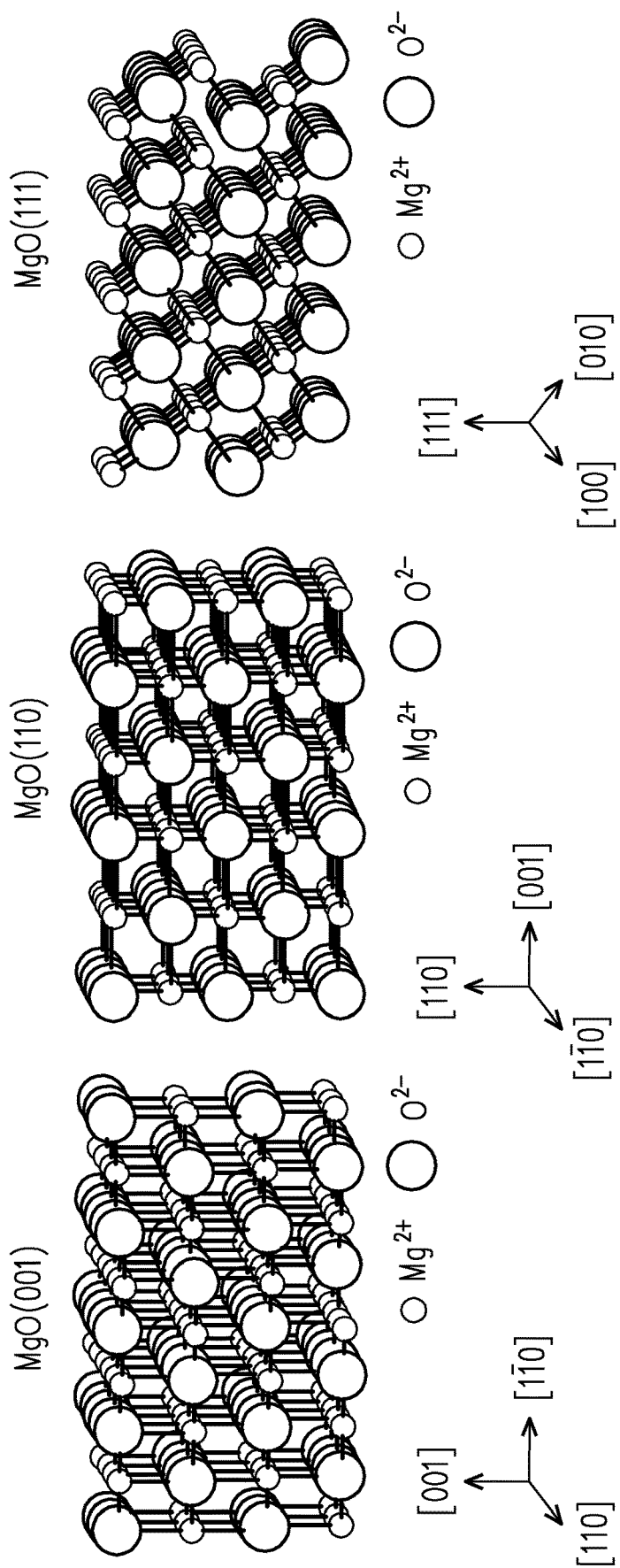
FIG. 1H to FIG. 1J are schematic views of different orientations of lattices of magnesium oxide according to some embodiments of the disclosure.

Referring to FIG. 1F and FIG. 1G, one or more contact holes 152, 154 are opened in the interlayer dielectric material layer 120a on both sides of the spacers 110. That is, the interlayer dielectric material layer 120a may be patterned to form an interlayer dielectric layer 120 including the contact holes 152, 154. The contact holes 152, 154 may open in the interlayer dielectric layer 120 in correspondence of the source and drain regions 104, 106. That is, the contact holes 152, 154 may vertically extend throughout the interlayer dielectric layer 120 to expose, at their bottom, the source and drain regions 104, 106. In some embodiments, each contact hole 152, 154 opens on a different source and drain region 104, 106. For example, the contact hole 152 opens on the (source) region 104, and the contact hole 154 opens on the (drain) region 106. In some embodiments, the contact holes 152, 154 may have the shape of inverted frustra (truncated cones or pyramids), being larger towards the top and narrowing down towards the source and drain regions 104, 106.

Source and drain contacts 162, 164 may be formed by providing a conductive material in the contact holes 152, 154. In some embodiments, the conductive material is disposed on the portions of the source and drain regions 104, 106 exposed by the contact holes 152, 154. In some embodiments, the conductive material of the source and drain contacts 162, 164 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by chemical vapor deposition (CVD), physical vapor deposition (PVD), atomic layer deposition (ALD), plating, other deposition techniques, or a combination thereof. In some embodiments, the conductive material may be provided on one or more seed layers, barrier layers, etc. (not shown). That is, the lower source and drain contacts 162, 164 may include one or more seed layers, barrier layers, etc. In some embodiments, a planarization process may further be performed, so that the top surfaces 110$t$ of the spacers 110, the top surface 120$t$ of the interlayer dielectric layer 120, the top surface 130$t$ of the gate structure 130 and the top surfaces 162$t$, 164$t$ of the source and drain contacts 162, 164 are substantially coplanar with respect to each other (are substantially at the same level height over the semiconductor substrate 102).

In some embodiments, when a ferroelectric material is included as layer of the gate structure 130 of the transistor 140, the ferroelectric polarization can be measured by monitoring the conductance in the transistor channel, thus realizing a non-volatile logic device. In some embodiments, the ferroelectric material of the ferroelectric layer 134 is disposed directly on the crystalline oxide material of the crystalline oxide layer 132. In some embodiments, the highly ordered structure of the crystalline oxide layer 132 may have a template effect on the ferroelectric layer 134, enhancing the uniformity of the domains of the ferroelectric material. For example, the measurable ferroelectric domain size for a given ferroelectric material deposited on the crystalline oxide layer 132 may be larger than the ferroelectric domain size for the same ferroelectric material deposited (in the same conditions) on an amorphous material. In some embodiments, the increased uniformity of the domains of the ferroelectric material may reduce the coercive voltage required to switch the ferroelectric domains, thus reducing the power consumption of the semiconductor device 100. In some embodiments, the speed of the semiconductor device 100 may also increase because of shorter wake-up times (the ordering time of the ferroelectric domains). In some embodiments, the enhanced uniformity of the ferroelectric layer 134 may improve the performance of the semiconductor device 100 in terms of reliability and cycling endurance. In some embodiments, the steps required to form the crystalline oxide layer 132 may be integrated within the manufacturing processes, without excessively increasing production costs.

It should be noted that while the semiconductor device 100 was shown as including the transistor 140 with a planar transistor geometry, the disclosure is not limited thereto. The crystalline oxide layer as template for the ferroelectric layer within the gate structure may be applied to any other transistor geometries (e.g., GAA, FinFET, etc.), which are also contemplated within the scope of the disclosure. Furthermore, additional process steps may be performed before, during, or after the steps illustrated in FIG. 1A to FIG. 1G. For example, multiple transistors 140 may be formed in and/or on the semiconductor substrate 102, and such transistors 140 may be connected to each other by an interconnection structure (not shown) formed during subsequent back-end-of-line processes. Cap layers, etch stop layers, additional interlayer dielectric layers, etc. (not shown) may also be formed. While manufacturing of the transistor 140 has been described with a gate replacement process, in some alternative embodiments, gate-first processes may be followed.

Figure 2A:
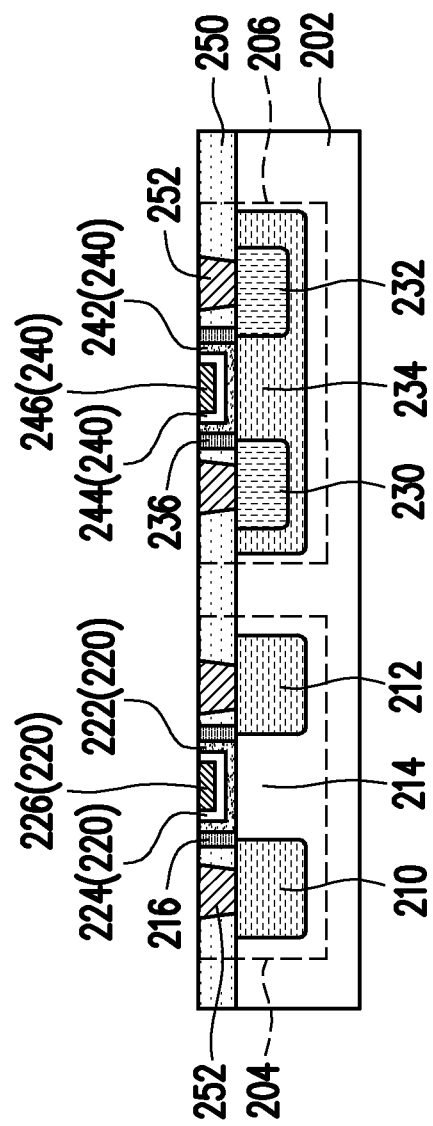

FIG. 2A to FIG. 2I are schematic cross-sectional views illustrating a manufacturing process of a semiconductor device 200 in accordance with some embodiments of the disclosure. Referring to FIG. 2A, in some embodiments, a semiconductor substrate 202 is provided. The material of the semiconductor substrate 202 may be selected as described above for the semiconductor substrate 102 (illustrated, e.g., in FIG. 1A). In some embodiments, devices of an integrated circuit are formed in and/or on the semiconductor substrate 202. For example, in FIG. 2A are illustrated two transistors 204, 206 formed in the semiconductor substrate 202. The transistor 204 includes at least one pair of source and drain regions 210, 212 separated by a portion of semiconductor substrate 202 which functions as a channel region 214. In some embodiments, the source and drain regions 210, 212 may be doped, for example with n-type materials or p-type materials. A gate structure 220 is disposed on the channel region 214 in between spacers 216. In some embodiments, the gate structure 220 includes an interface dielectric layer 222, a high-k dielectric layer 224, and a gate metal layer 226 sequentially stacked on the channel region 214 in between the spacers 216. In some embodiments, the interface dielectric layer 222 may include a dielectric material such as silicon oxide or silicon oxynitride. In some alternative embodiments, the interface dielectric layer 222 may include a crystalline oxide material, similar to what was previously described for the crystalline oxide blanket layer 132$a$ (illustrated, e.g., in FIG. 1C). In some embodiments, the high-k dielectric layer 224 has a dielectric constant greater than about 4, greater than about 12, greater than about 16, or even greater than about 20. For example, a material of the high-k dielectric layer 224 may include a metal oxide, such as $ZrO_2$, $Gd_2O_3$, $HfO_2$, $BaTiO_3$, $Al_2O_3$, $LaO_2$, $TiO_2$, $Ta_2Os$, $Y_2O_3$, STO, BTO, BaZrO, HfZrO, HfLaO, HfTaO, HfTiO, a combination thereof, or other suitable materials. The gate metal layer 226 may include similar material as previously described with reference to the gate metal blanket layer 136$a$ (illustrated, e.g., in FIG. 1E). In some embodiments, the transistor 206 also includes a pair of source and drain regions 230, 232, which may be optionally doped with n-type materials or p-type materials. In some embodiments, the source and drain regions 230, 232 are doped with materials of opposite conductivity type with respect to the source and drain regions 210, 212. In some embodiments, the source and drain regions 230, 232 may be embedded in a region 234 doped with a material of opposite conductivity type. For example, the source and drain regions 230, 232 may be doped with a p-type material, and the region 234 may be doped with an n-type material. In some embodiments, a gate structure 240 is disposed on the region 234 in between the spacers 236. In some embodiments, the gate structure 240 includes an interface dielectric layer 242, a high-k dielectric layer 244, and a gate metal layer 246. Compositions of the interface dielectric layer 242, high-k dielectric layer 244 and gate metal layer 246 may be selected as previously described with reference to the corresponding elements of the transistor 204. In some embodiments, the high-k dielectric layers 224, 244 of one or both of the transistors 204, 206 may include a ferroelectric material. That is, one or both of the transistors 204, 206 may have a similar structure as the transistor 140 illustrated in FIG. 1G. However, the disclosure is not limited thereto, and, in some alternative embodiments, the transistors 204, 206 may include amorphous dielectric materials as interface dielectric layers 222 or 242, and non-ferroelectric materials as high-k dielectric layers 224 or 244. It should be noted that while planar transistors 204, 206 are illustrated in FIG. 2A, the disclosure is not limited thereto, and other types of transistor (e.g., GAA, FinFET, etc.) are also contemplated within the scope of the disclosure. Similarly, devices other than transistors (e.g., inductors, resistors, capacitors, diodes, and so on) may also be formed in and/or on the semiconductor substrate 202. In some embodiments, an interlayer dielectric layer 250 may be formed on the semiconductor substrate 202. Source and drain contacts 252 may extend through the interlayer dielectric layer 250 to contact the source and drain regions 210, 212, 230, 232.

Figure 2B:
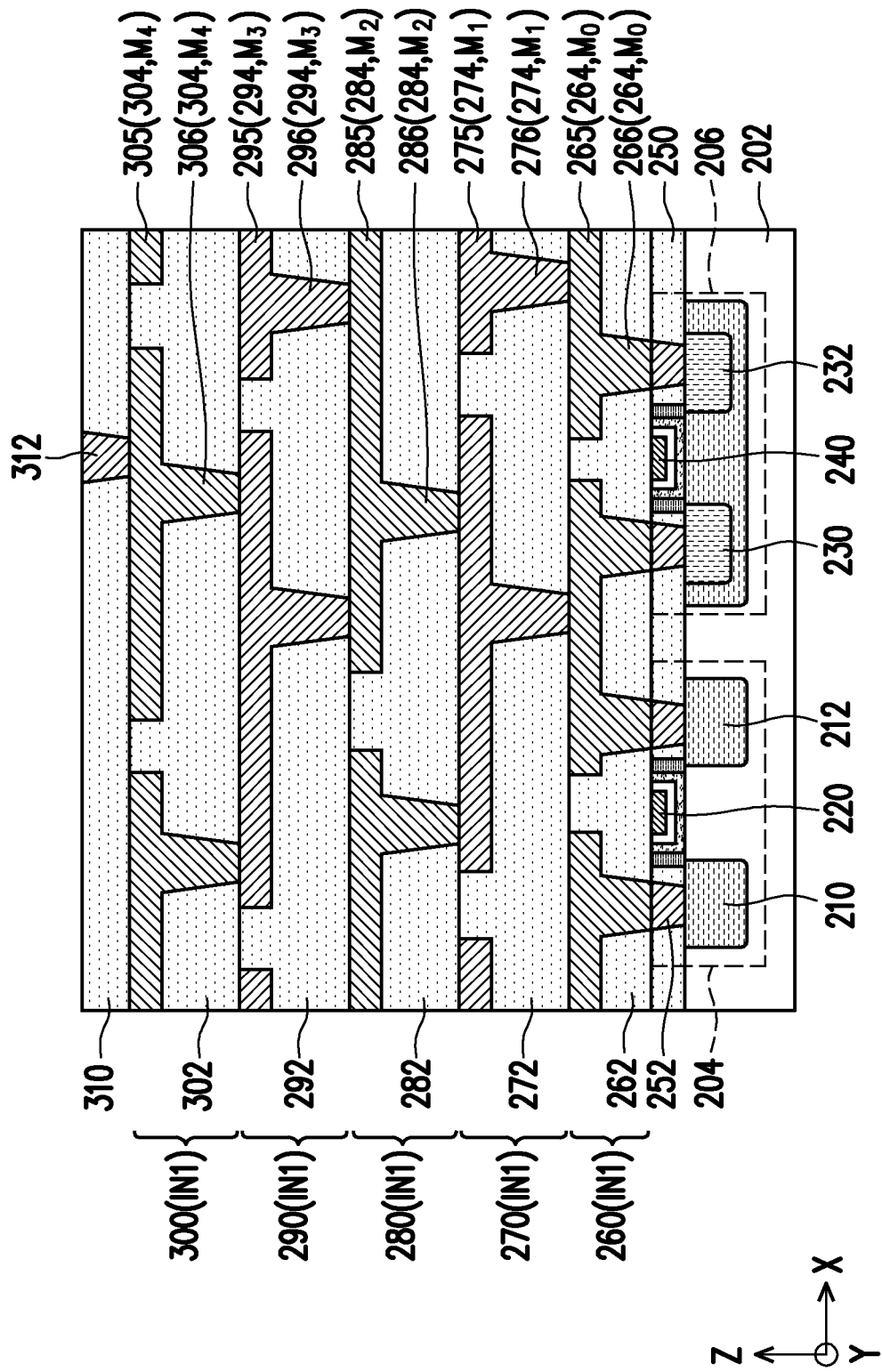

Referring to FIG. 2B, in some embodiments, the lower interconnection tiers 260, 270, 280, 290, 300 of an interconnection structure IN1 are formed over the semiconductor substrate 202. In some embodiments, the tiers 260, 270, 280, 290, 300 of the interconnection structure IN1 include interlayer dielectric layers 262, 272, 282, 292, 302 and conductive patterns 264, 274, 284, 294, 304 disposed on and extending through the corresponding interlayer dielectric layers 262, 272, 282, 292, 302. For example, the bottommost tier 260 includes the interlayer dielectric layer 262 disposed on the semiconductor substrate 202 and the conductive patterns 264 disposed on and through the interlayer dielectric layer 262. The conductive patterns 264 may include routing traces 265 and interconnect vias 266. The routing traces 265 may extend horizontally (e.g., in the XY plane, substantially parallel to the semiconductor substrate 202) on the interlayer dielectric layer 262, while the interconnect vias 266 may extend vertically (in the Z direction) through the interlayer dielectric layer 262 to establish electrical connection between the routing traces 265 and the devices (e.g., the transistors 204, 206) formed in and/or on the semiconductor substrate 202. For example, the interconnect vias 266 may land on the source and drain contacts 252. Similarly, the second tier 270 of the interconnection structure IN1 is stacked on the bottommost tier 260, and also includes an interlayer dielectric layer 272 and conductive patterns 274. The conductive patterns 274 may include routing traces 275 and interconnect vias 276 extending through the interlayer dielectric layer 272 to establish electrical connection between the routing traces 265 and the routing traces 275. Additional tiers 280, 290, 300 may be stacked on the lowest tiers 260, 270, each tier of the additional tiers 280, 290, 300 including its own interlayer dielectric layer 282, 292, 302 and conductive patterns 284, 294, 304 having routing traces 285, 295, 305 and interconnect vias 286, 296, 306.

In some embodiments, the conductive patterns 264, 274, 284, 294, 304 may be considered part of metallization levels of the interconnection structure IN1, and may be sequentially numbered starting from $M_0$ for the metallization level closest to the semiconductor substrate 202. For example, the conductive patterns 264 may be referred to as metallization level $M_0$, the conductive patterns 274 may be referred to as a metallization level $M_1$, and so on. In some embodiments, the tiers 260, 270, 280, 290, 300 of the interconnection structure IN1 may be formed via damascene, dual damascene, or other suitable processes. The position (in terms of level height with respect to the semiconductor substrate 202) of the boundaries between the interlayer dielectric layers 262, 272, 282, 292, 302 may depend on the process followed for the formation of the interconnection structure IN1, and is not limited to the one illustrated in the drawings. In some embodiments, an interlayer dielectric layer 310 is formed on the topmost additional tier 300, covering the conductive patterns 304 of the topmost additional tier 300. In some embodiments, the interlayer dielectric layer 310 may be patterned so as to include openings exposing portions of the conductive patterns 304, which openings are filled by conductive vias 312.

Figure 2C:
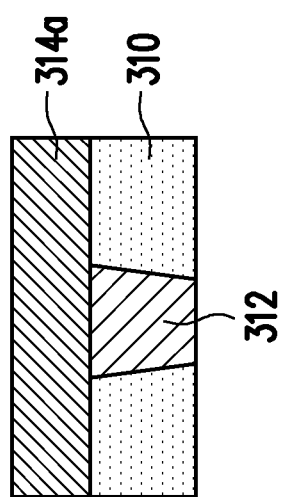

For clarity of illustration, in the schematic cross-sectional views of FIG. 2C to FIG. 2H is illustrated only a portion of the interconnection structure IN1, and the elements below the interlayer dielectric layer 310 are omitted from the drawings. Referring to FIG. 2C, a bottom metallic layer 314a is formed on the interlayer dielectric layer 310. The bottom metallic layer 314a contacts at least one of the conductive vias 312, and possibly, more than one of the conductive vias 312. In some embodiments, the bottom metallic layer 314a includes cobalt (Co), tungsten (W), copper (Cu), titanium (Ti), tantalum (Ta), aluminum (Al), zirconium (Zr), hafnium (Hf), TiN, TaN, a combination thereof, or other suitable conductive (metallic) materials. In some embodiments, the bottom metallic layer 314a may be formed by chemical vapor deposition (CVD), physical vapor deposition (PVD), atomic layer deposition (ALD), other deposition techniques, or a combination thereof. In some embodiments, the bottom metallic layer 314a may be formed on one or more seed layers, barrier layers, etc. (not shown).

Figure 2D:
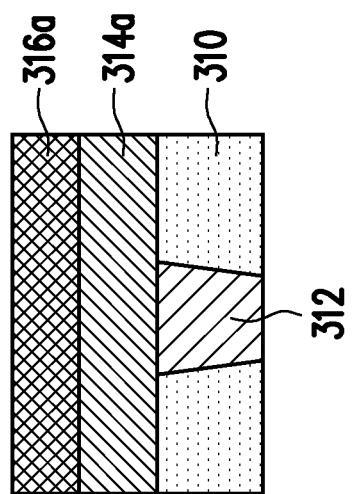
Figure 2E:
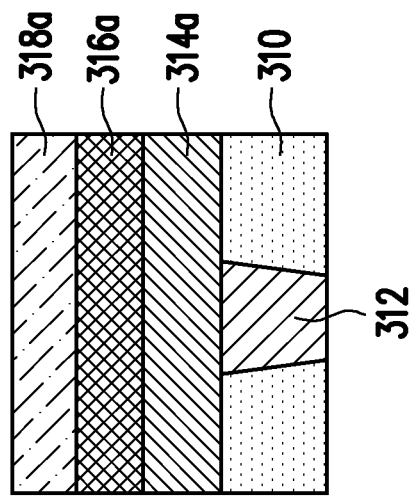
Figure 2H:
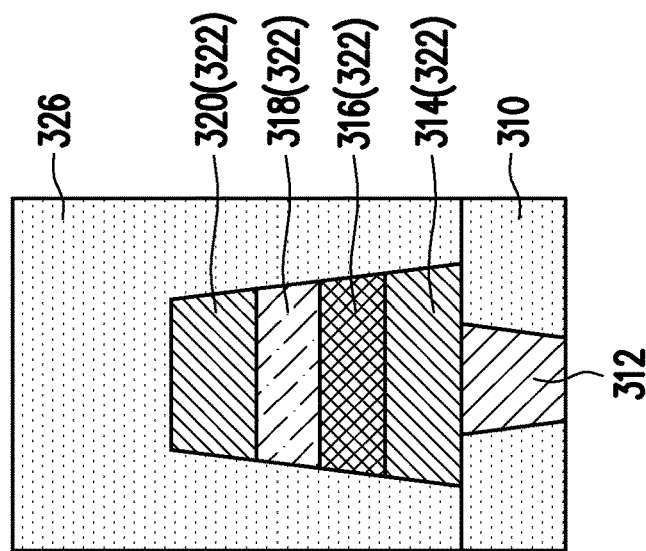

In some embodiments, a crystalline oxide blanket layer 316a is formed on the bottom metallic layer 314a, as illustrated in FIG. 2D. In some embodiments, the crystalline oxide blanket layer 316a may be formed employing similar material and processes as previously discussed for the crystalline oxide blanket layer 132a (illustrated, e.g., in FIG. 1C). Thereafter, as illustrated in FIG. 2E, a ferroelectric blanket layer 318a is formed on the crystalline oxide blanket layer 316a, with similar material and processes as previously described for the ferroelectric blanket layer 134a (illustrated, e.g., in FIG. 1D). The ferroelectric blanket layer 318a may be in direct contact with the crystalline oxide blanket layer 316a, which may act as a template to enhance the uniformity of the ferroelectric domains of the ferroelectric blanket layer 318a. As illustrated in FIG. 2F, a top metallic layer 320a may then be formed on the ferroelectric blanket layer 318a, with similar material and processes as previously described for the bottom metallic layer 314a. In some embodiments, the bottom metallic layer 314a, the crystalline oxide blanket layer 316a, the ferroelectric blanket layer 318a, and the top metallic layer 320a may be referred to as a stack of layers 322a. In some embodiments, a patterned mask 324 is formed on the top metallic layer 320a. In some embodiments, the patterned mask 324 includes a plurality of disconnected blocks or portions formed on the stack of layers 322a in correspondence of the conductive vias 312. In some embodiments, the patterned mask 324 may be an oxide-or nitride-based hard mask. In some alternative embodiments, the patterned mask 324 may include a photoresist material. In some embodiments, the patterned mask 324 may be provided through a sequence of deposition, exposure, and development steps.

Figure 2G:
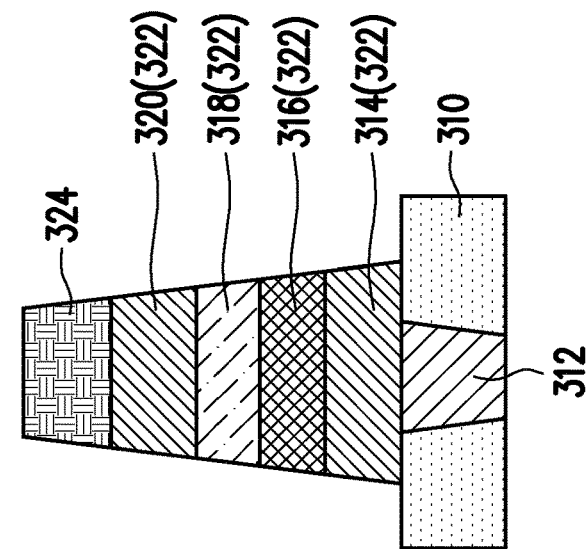
Figure 2F:
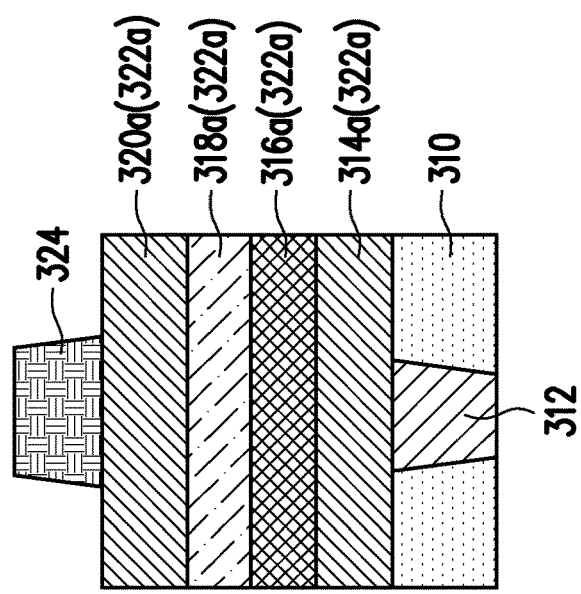
Figure 21:
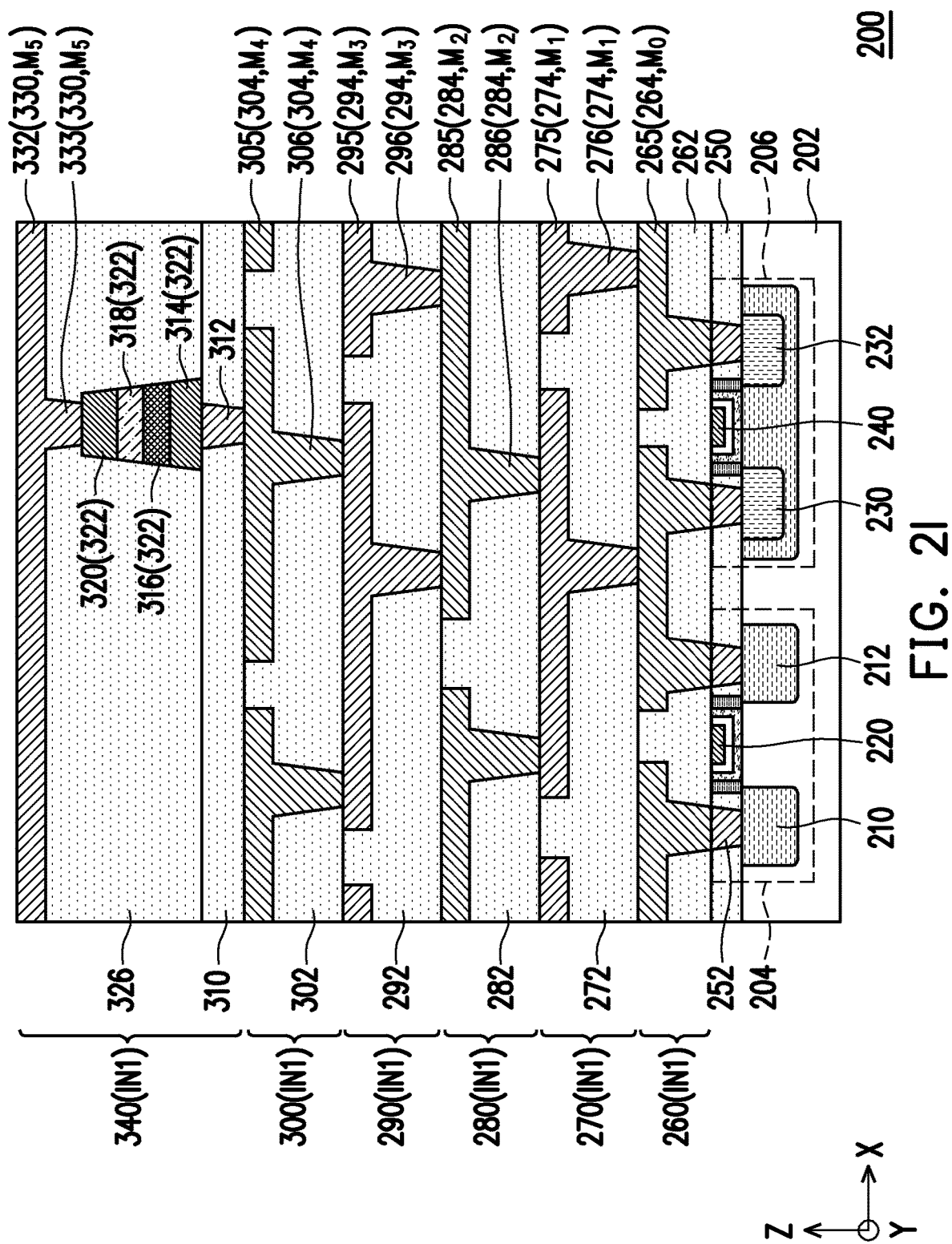

Referring to FIG. 2G, in some embodiments, the pattern of the patterned mask 324 may be transferred to the underlying stack of layers 322a during one or more etching steps. In some embodiments, following etching, as many ferroelectric tunnel junctions 322 are formed on the interlayer dielectric layer 310 as there are isolated blocks of the patterned mask 324. In some embodiments, a ferroelectric tunnel junction 322 includes a bottom electrode 314 and a top electrode 320 formed from portions of the bottom metallic layer 314a and the top metallic layer 320a, respectively. In between the electrodes 314, 320 are a crystalline oxide layer 316 and a ferroelectric layer 318, with the ferroelectric layer 318 being disposed directly on the crystalline oxide layer 316. In some embodiments, depending on the etching conditions adopted during the patterning step, the ferroelectric tunnel junctions 322 may have tapered sidewalls. In some embodiments, the patterned mask 324 may be removed, for example through ashing or stripping, and an interlayer dielectric layer 326 burying the ferroelectric tunnel junctions 322 may be formed, as illustrated, e.g., in FIG. 2H. Thereafter, referring to FIG. 2I, conductive patterns 330 may be formed on and through the interlayer dielectric layer 326 to contact the top electrodes 320 of the ferroelectric tunnel junctions 322. In some embodiments, at least one of the conductive patterns 330 contacts multiple ferroelectric tunnel junctions 322. For example, the conductive patterns 330 may include conductive strips 332 extending parallel to each other along the X direction, and one of such conductive strips 332 may be connected by conductive vias 333 to ferroelectric tunnel junctions 322 disposed as a row extending along the X direction, at a same level height along the Y direction. In some embodiments, if portions of the patterned mask 324 (illustrated, e.g., in FIG. 2G) remains on the top electrode 320, the conductive vias 333 may extend through such remaining portions to directly contact the top electrode 320. In some embodiments, the conductive strips 332 may be separated from each other along the Y direction by portions of the interlayer dielectric layer 326. In some embodiments, further processes (e.g., post-fab processes) may be performed after formation of the upper tiers of the interconnection structure IN1.

FIG. 2I is a schematic cross-sectional view of the semiconductor device 200 according to some embodiments of the disclosure. As described above, the semiconductor device 200 includes front-end-of-line transistors 204, 206 (amongst other devices) formed in and/or on a semiconductor substrate 202, and an interconnection structure IN1 disposed on the semiconductor substrate 202 including a plurality of interconnection tiers 260, 270, 280, 290, 300, 340. In some embodiments, the semiconductor device 200 includes a memory region in which a plurality of memory cells is formed. In some embodiments, ferroelectric tunnel junctions 322 are formed in one of the tiers of the interconnection structure IN1, which may be referred to as a ferroelectric junction tier 340, where each memory cell includes a ferroelectric tunnel junction 322. In some embodiments, the ferroelectric tunnel junctions 322 may be connected through the underlying conductive vias 312 to the lower interconnection tiers 260, 270, 280, 290, 300, and to the transistors 204, 206 formed in and/or on the semiconductor substrate 202. For example, the ferroelectric tunnel junctions 322 may be connected to the drain regions 212 of the transistors 204 to receive current flowing through the transistors 204, which may be configured to act as driving transistors for the ferroelectric tunnel junctions 322. That is, the gate patterns 220 of the transistors 204 may be configured as word lines for the memory cells, while the conductive strips 332 may be configured to act as bit lines. It should be noted that while the conductive strips 332 (bit lines) are illustrated in FIG. 2I as being included in the same ferroelectric junction tier 340 as the ferroelectric tunnel junctions 322, the disclosure is not limited thereto. In some alternative embodiments, one or more connection tiers may be interposed between the ferroelectric tunnel junctions 322 and the conductive strips 332, with conductive patterns of the connection tiers establishing electrical connection between the ferroelectric tunnel junctions 322 and the conductive strips 332. Furthermore, it should be noted that while in FIG. 2I the ferroelectric tunnel junctions 322 are illustrated as being formed on the metallization level $M_4$, the disclosure is not limited thereto. In some alternative embodiments, the ferroelectric tunnel junctions 322 may be formed on other metallization levels, for example on any one of the metallization levels $M_3$ to $M_g$.

In some embodiments, the ferroelectric material of the ferroelectric layers 318 of the ferroelectric tunnel junctions 322 is disposed directly on the crystalline oxide layers 316. In some embodiments, the highly ordered structure of the crystalline oxide layers 316 may have a template effect on the overlying ferroelectric layers 318, enhancing the uniformity of the domains of the ferroelectric material. In some embodiments, the increased uniformity of the domains of the ferroelectric material may reduce the coercive voltage required to switch the ferroelectric domains, thus reducing the power consumption of the semiconductor device 200. In some embodiments, the speed of the semiconductor device 200 may also increase because of shorter wake-up times (the ordering time of the ferroelectric domains). In some embodiments, the enhanced uniformity of the ferroelectric layers 318 may improve the performance of the semiconductor device 200 in terms of process variability and cycling endurance.

FIG. 3A to FIG. 3G are schematic cross-sectional views illustrating a manufacturing process of a semiconductor device 400 in accordance with some embodiments of the disclosure. Briefly, devices including transistors 404, 406 are formed in and/or on a semiconductor substrate 402. The transistor 404 includes source and drain regions 410, 412 disposed at opposite ends of a channel region 414. A gate structure 420 is formed on the channel region 414. Similarly, the transistor 406 includes source and drain regions 430, 432, optionally formed within a doped region 434. A gate structure 440 is formed on the doped region 434 in between the source and drain regions 430, 432. An interlayer dielectric layer 450 is formed on the semiconductor substrate 402, as well as source and drain contacts 452 extending through the interlayer dielectric layer 450 to contact the source and drain regions 410, 412, 430, 432.

In some embodiments, the lower interconnection tiers 460, 470, 480 of an interconnection structure IN2 are formed on the semiconductor substrate 402. In some embodiments, the tiers 460, 470, 480 of the interconnection structure IN2 include interlayer dielectric layers 462, 472, 482 and conductive patterns 464, 474, 484, 486 disposed on and through the corresponding interlayer dielectric layers 462, 472, 482. Materials and manufacturing processes of the interlayer dielectric layers 462, 472, 482, and of the conductive patterns 464, 474, 484, 486 may be selected as previously described. Depending on the number of additional tiers 480, the conductive patterns 484 may be referred to as metallization levels $M_2$ to $M_{n-1}$, and the conductive patterns 486 of the topmost additional tier 480 may be referred as an $n^{th}$ metallization level $M_n$. In some embodiments, n can be an integer in the range from 3 to 8.

Figure 3A:
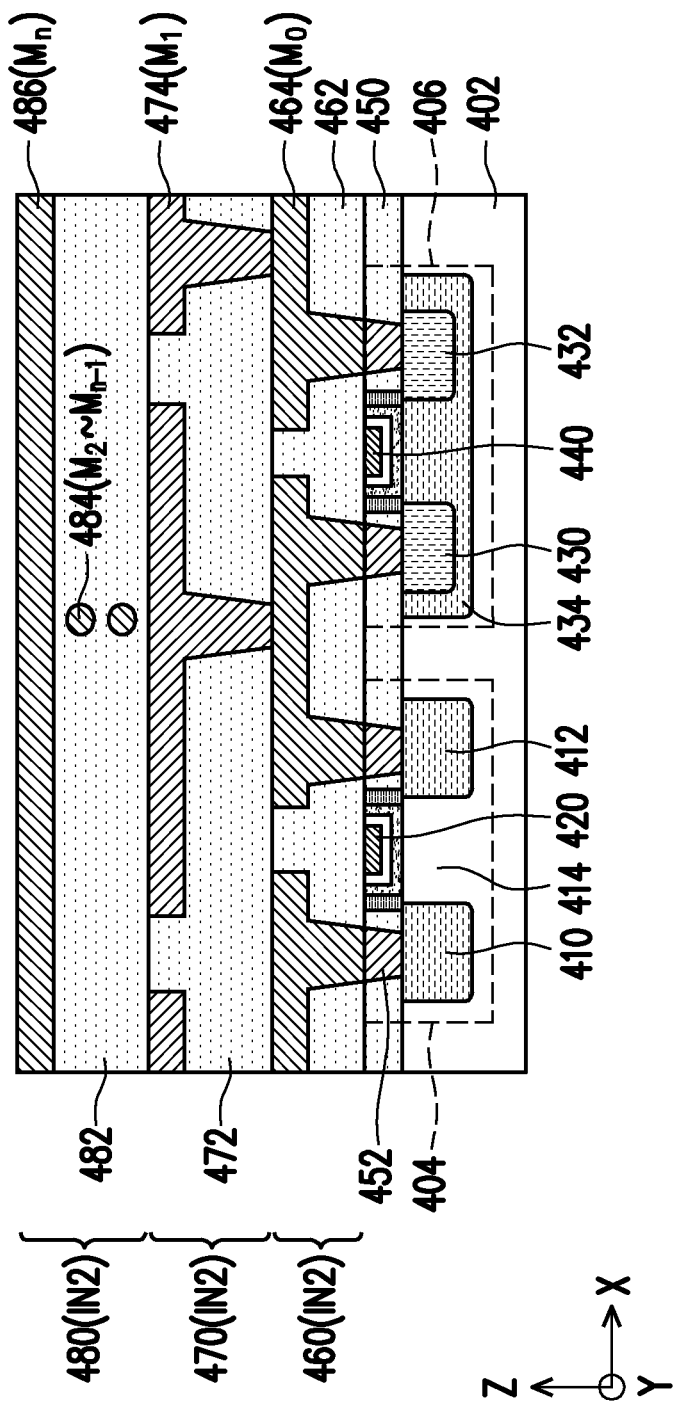
FIG. 3A to FIG 3H are schematic cross-sectional views of structures formed during a manufacturing process of a semiconductor device in accordance with some embodiments of the disclosure.
Figure 3B:
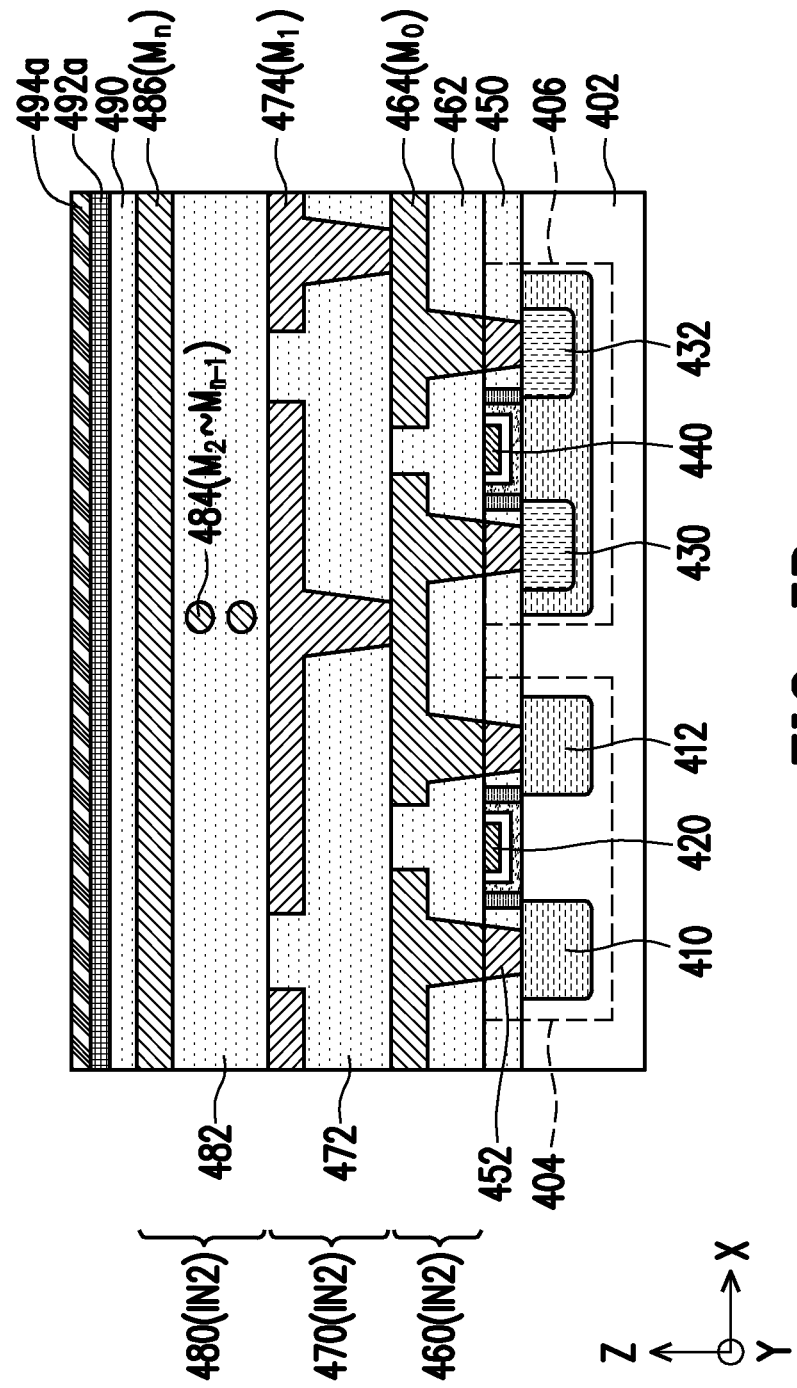

Referring to FIG. 3B, an interlayer dielectric layer 490 is formed on the topmost additional tier 480, covering the conductive patterns 486. A semiconductor channel layer 492a is formed on the interlayer dielectric layer 490. In some embodiments, the semiconductor channel layer 492a includes a semiconductor oxide material. In some embodiments, the semiconductor channel layer 492a includes a ternary or higher (e.g., quaternary and so on) semiconductor oxide material, such as indium gallium zinc oxide (IGZO), indium zinc oxide (IZO), or indium tin oxide (ITO). In some embodiments, the material of the semiconductor channel layer 492a may be deposited by suitable techniques, such as CVD, ALD, PVD, PECVD, epitaxy, or the like. Thereafter, a high-k dielectric layer 494a is deposited, blanketly covering the semiconductor channel layer 492a. In some embodiments, the material of the high-k dielectric layer 494a has a dielectric constant greater than about 4, greater than about 12, greater than about 16, or even greater than about 20. For example, a material of the high-k dielectric layer 494a may include a metal oxide, such as $ZrO_2$, $Gd_2O_3$, $HfO_2$, $BaTiO_3$, $Al_2O_3$, $LaO_2$, $TiO_2$, $Y_2O_3$, STO, BTO, BaZrO, HfZrO, HfLaO, HfTaO, HfTiO, or a combination thereof. In some alternative embodiments, the high-k dielectric layer 494a may optionally include a silicate such as HfSiO, HfSiON, LaSiO, AlSiO, or a combination thereof. In some embodiments, the method of forming the high-k dielectric layer 494a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, as illustrated with reference to FIG. 3B and FIG. 3C, the high-k dielectric layer 494a and semiconductor channel layer 492a may be patterned to form one or more channel patterns 492 having high-k dielectric patterns 494b disposed on top. In some embodiments, stacks including a channel pattern 492 and a high-k dielectric pattern 494b are formed in an array, for example with the stacked layers being disposed along columns and rows of the array. The separation between adjacent stacks may be selected as a function of the footprint of the channel patterns 492. In some embodiments, the regions of the interlayer dielectric layer 490 underlying the channel patterns 492 (illustrated between dashed lines in FIG. 3C) may be referred to as buffer layer, with reference to its function of separating the semiconductor material of the channel patterns 492 from the conductive patterns 486. In some alternative embodiments, the interlayer dielectric layer 490 may be patterned to have the same footprint as the channel patterns 492, leaving the buffer layers in between the channel patterns 492 and the conductive patterns 486, In FIG. 3C one stack of a channel pattern 492 and a high-k dielectric pattern 494b are illustrated to represent a plurality of such stacks that are formed in the interconnection structure IN2. The disclosure does not limit the number of channel patterns 492 which may be formed. An interlayer dielectric material layer 496a is provided on the interlayer dielectric layer 490 to encapsulate the channel patterns 492 and the high-k dielectric patterns 494b. In some embodiments, the interlayer dielectric material layer 496a is deposited so as to initially bury the high-k dielectric patterns 494b. That is, the side surfaces of the channel patterns 492 and the top and side surfaces of the high-k dielectric patterns 494b may be covered by the interlayer dielectric material layer 496a.

Figure 3C:
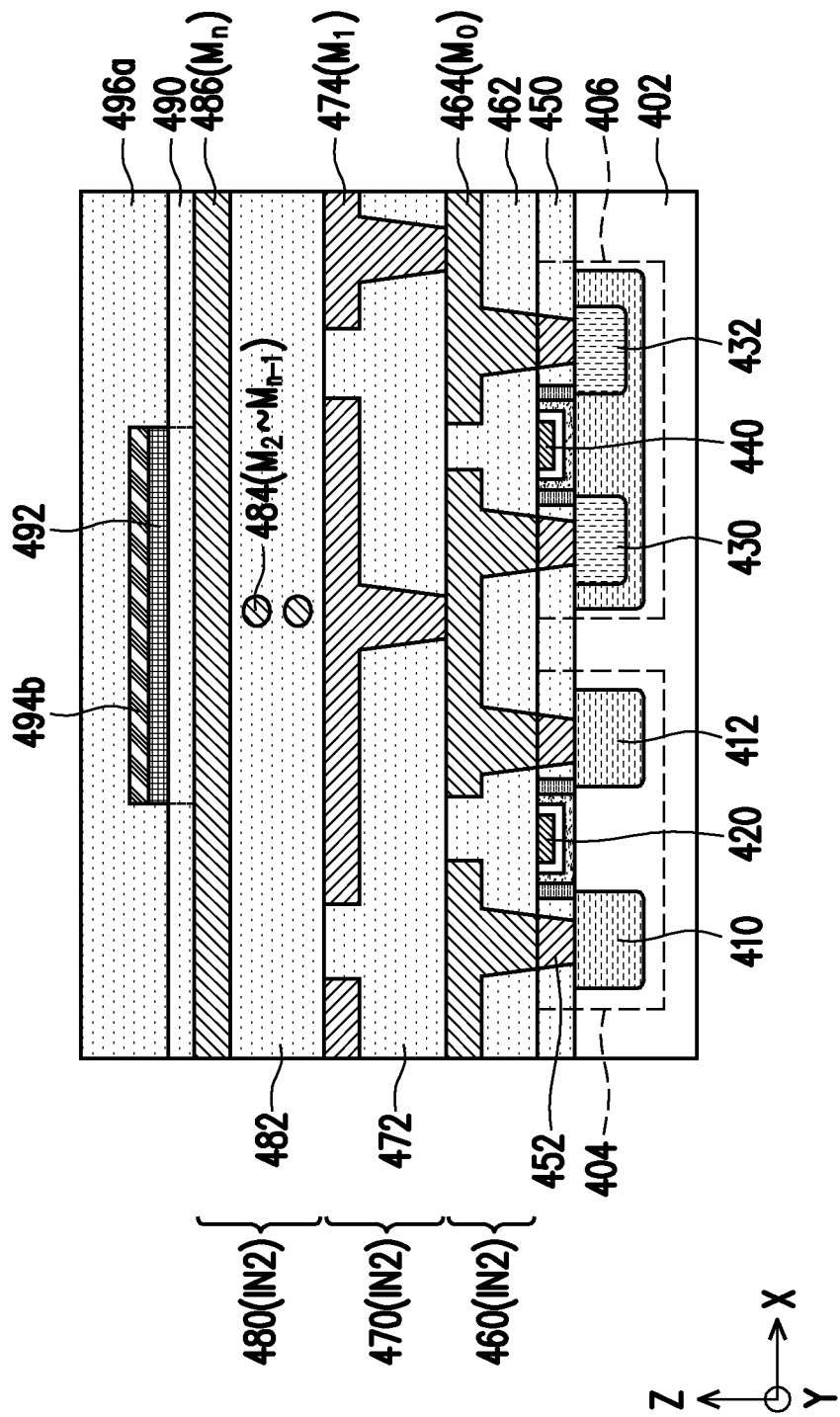
Figure 3D:
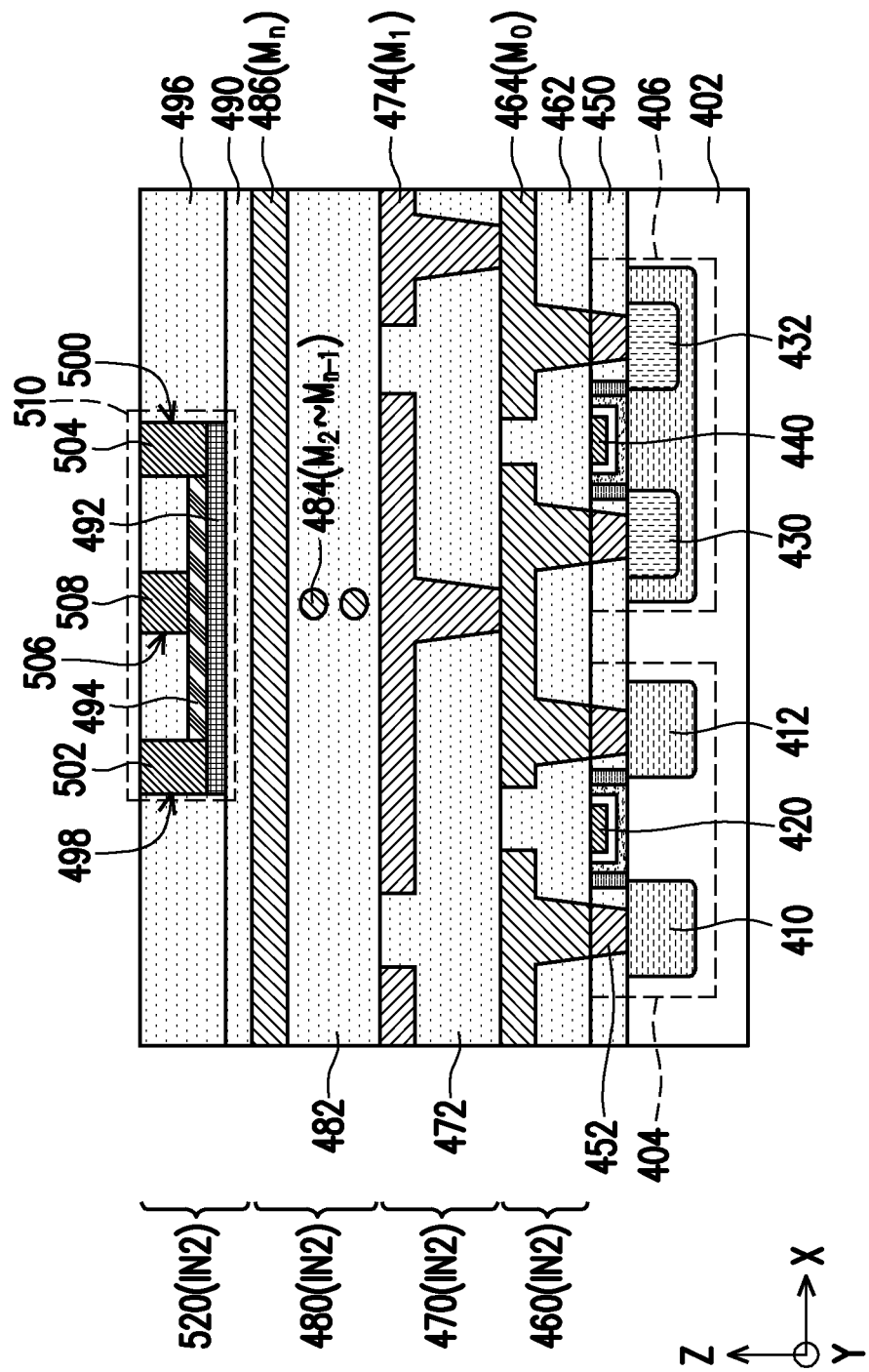

Referring to FIG. 3C and FIG. 3D, in some embodiments, source and drain openings 498, 500 are formed through the interlayer dielectric material layer 496a at two ends of a channel pattern 492. For example, if the channel pattern 492 and the high-k dielectric pattern 494b are elongated along the X direction, a pair of source and drain openings 498, 500 may overlay the same channel pattern 492. One opening (e.g., the source opening 498) of the pair may overlay one end of the channel pattern 492, and the other opening (e.g., the drain opening 500) of the pair may overlay the other end of the same channel pattern 492. Upon formation of the source and drain openings 498, 500, shortened high-k dielectric patterns 494 remains on the channel patterns 492, and the channel patterns 492 may protrude on both sides in an elongating direction (e.g., the X direction) with respect to the overlying shortened high-k dielectric pattern 494. In some embodiments, each channel pattern 492 is exposed at the bottom of at least a pair of source and drain openings 498, 500.

In some embodiments a metallic material is filled in the source and drain openings 498, 500 at the two ends of the channel pattern 492 to form source and drain contacts 502, 504, respectively. In some embodiments, the metallic material of the source and drain contacts 502, 504 may include cobalt (Co), tungsten (W), copper (Cu), titanium (Ti), tantalum (Ta), aluminum (Al), zirconium (Zr), hafnium (Hf), a combination thereof, or other suitable metallic materials, and be formed through CVD, ALD, plating or other suitable deposition techniques. Furthermore, the interlayer dielectric layer 496 includes gate trenches 506 in between pairs of source and drain contacts 502, 504 formed on a same channel pattern 492. In some embodiments, the gate trenches 506 expose portions of the high-k dielectric pattern 494 overlying the channel pattern 492. In some embodiments, the gate trenches 506 are elongated along the Y direction, and each gate trench 506 may expose multiple high-k dielectric patterns 494 overlying corresponding channel patterns 492. A metallic material is disposed in the gate trenches 506 to form gate patterns 508 separated from the channel patterns 492 by the high-k dielectric pattern 494. In some embodiments, the metallic material of the gate patterns 508 includes copper (Cu), titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate patterns 508 may also include materials to fine-tune the corresponding work function. For example, the metallic material of the gate patterns 508 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, a channel pattern 492 having a high-k dielectric pattern 494 and a gate pattern 508 disposed in between a pair of source and drain contacts 502, 504 may form a transistor 510. The tier 520 in which the transistors 510 are formed may be sometimes referred to as an active device tier.

Figure 3E:
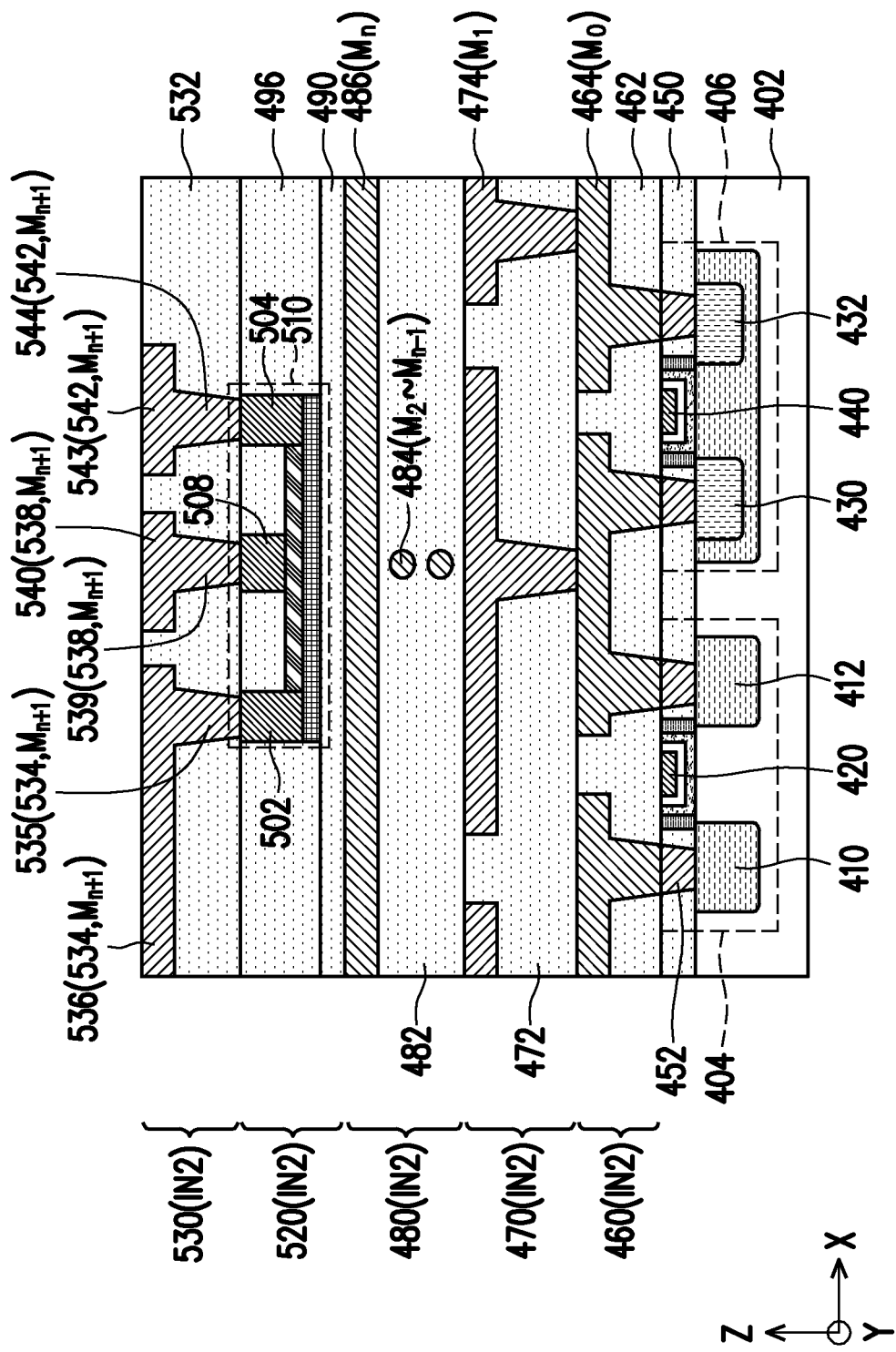

Referring to FIG. 3E, a connection tier 530 may be formed on the active device tier 520. The connection tier 530 includes conductive patterns 534, 538, 542 formed in an interlayer dielectric layer 532. In some embodiments, the conductive patterns 534, 538, 542 are connected to the source contacts 502, the gate patterns 508, and the drain contacts 504 of the transistors 510, respectively. In some embodiments, the conductive patterns 534, 538, 542 belong to the metallization level $M_{n+1}$, a level higher with respect to the metallization level $M_n$ on which the transistors 510 are formed. The conductive patterns 534 may include routing traces 536 and conductive vias 535 connecting the routing traces 536 to the source contacts 502. Similarly, the conductive patterns 538 may include routing traces 540 connected to the gate patterns 508 by conductive vias 539. The conductive patterns 542 may include conductive plates 543 connected to the drain contacts 504 by conductive vias 544. The conductive patterns 534, 538, 542 may be separated from each other by portions of the interlayer dielectric layer 532.

Figure 3F:
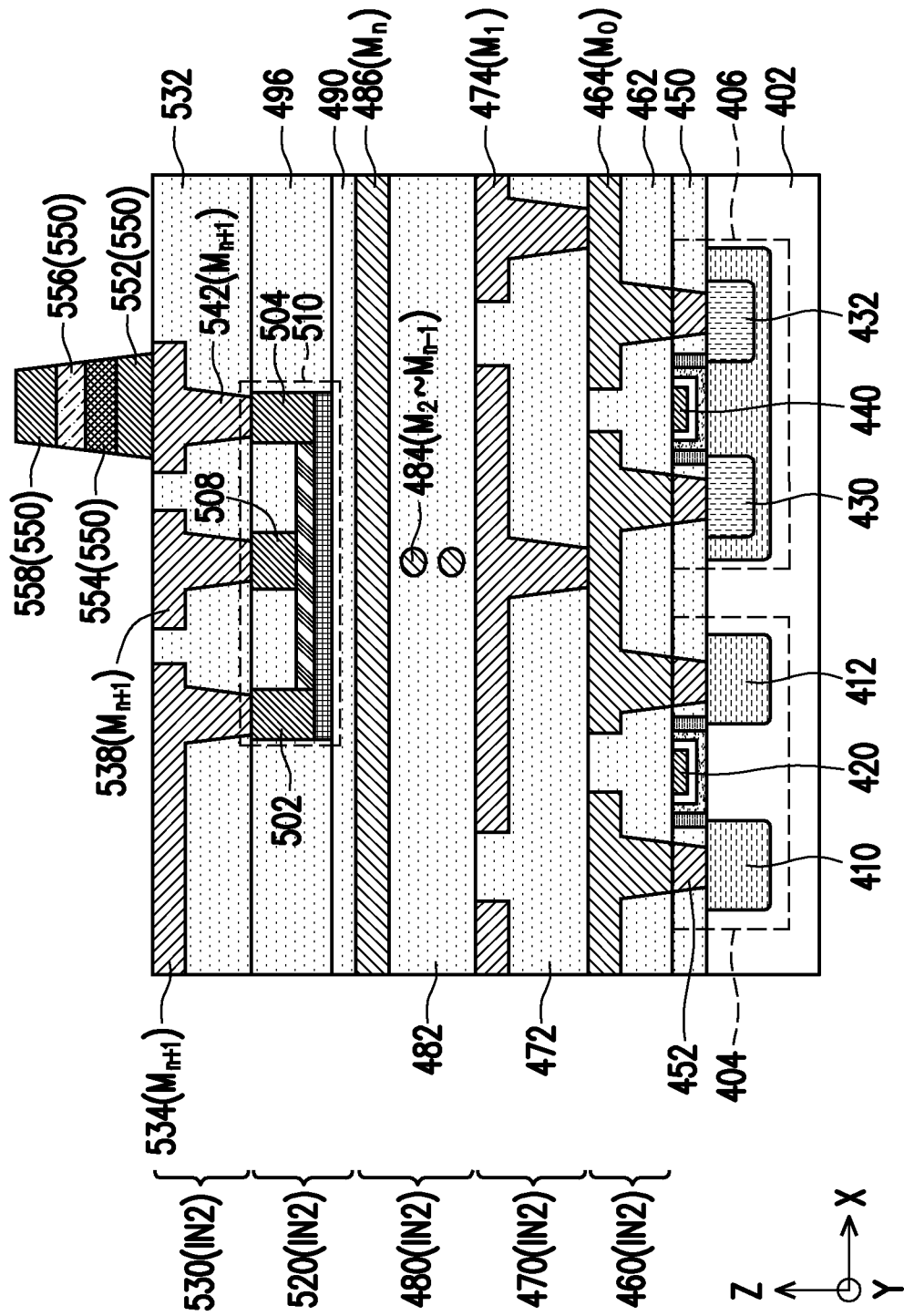
Figure 3G:
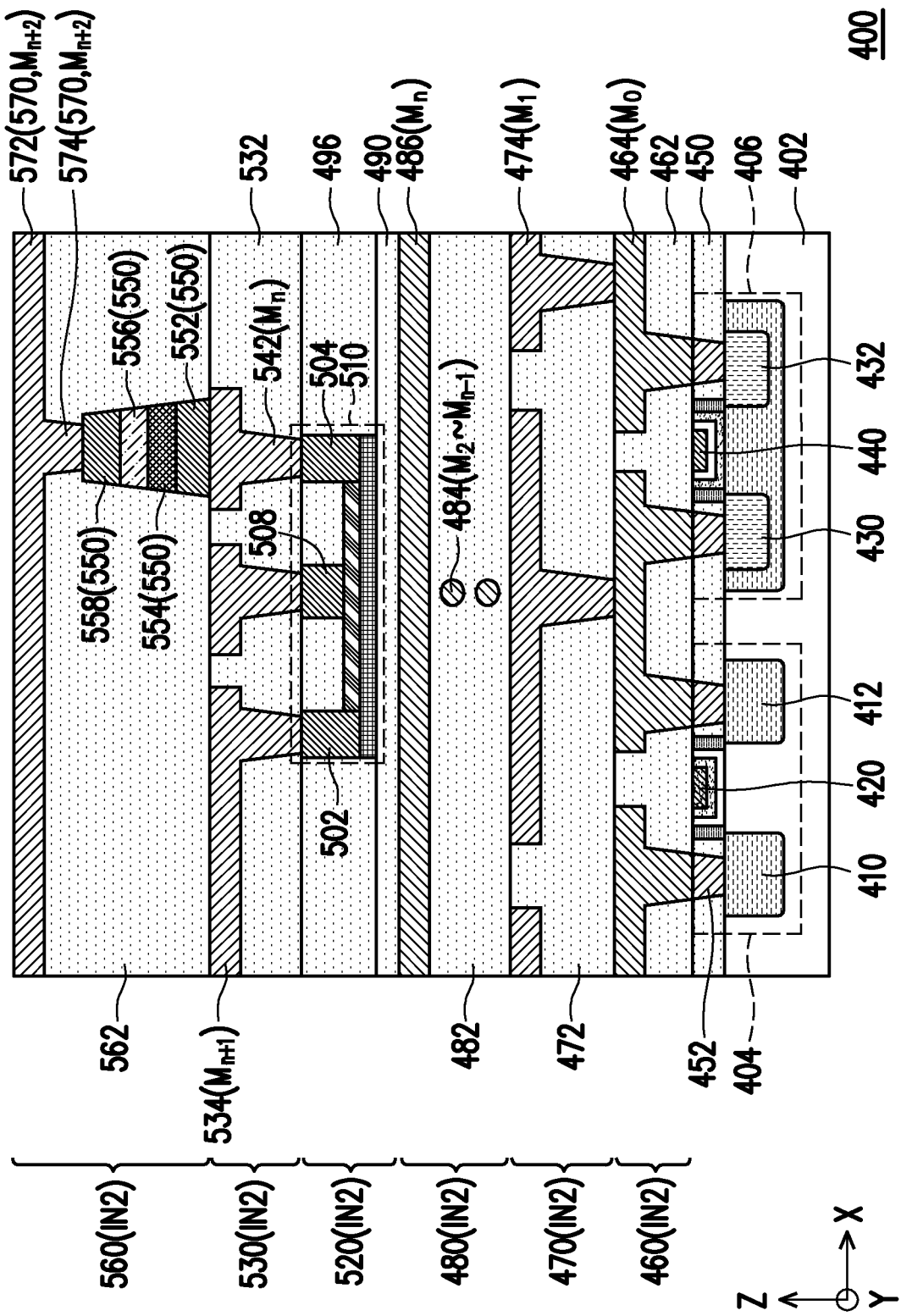

Referring to FIG. 3F, in some embodiments, ferroelectric tunnel junctions 550 are formed on the conductive patterns 542. The ferroelectric tunnel junctions 550 may include a bottom electrode 552, a crystalline oxide layer 554, a ferroelectric layer 556 and a top electrode 558 sequentially stacked. In some embodiments, materials and processes to manufacture the ferroelectric tunnel junctions 550 may be similar to the ones previously described for the ferroelectric tunnel junctions 322 with reference to FIG. 2C to FIG. 2G. Referring to FIG. 3G, a ferroelectric junction tier 560 may be formed by providing the interlayer dielectric layer 562 embedding the ferroelectric tunnel junctions 550, and by forming the conductive patterns 570, including the conductive strips 572 configured to act as bit lines, and the conductive vias 574 connecting the conductive strips 572 to the top electrodes 558 of the ferroelectric tunnel junctions 550.

In some embodiments, a ferroelectric tunnel junction 550 connected to a drain contact 504 of a back-end-of-line transistor 510 may be considered a memory cell of the semiconductor device 400. In some embodiments, a plurality of such memory cells is formed in an array in the interconnection structure IN2. That is, the semiconductor device 400 may be or include a high-density non-volatile memory such as a ferroelectric random-access memory (FeRAM). The drain contact 504 of the transistor 510 and the ferroelectric tunnel junction 550 may be connected by the conductive patterns (e.g., the conductive patterns 542) of one or more connection tiers 530 of the interconnection structure IN2. It will be apparent that while the transistors 510 were illustrated with a specific transistor geometry, the disclosure is not limited thereto. For examples, the back-end-of-line transistors may be planar transistors with back-gate geometry, double-gate geometry, FinFET transistors, gate-all-around transistors, or any other gate geometry which may be realized for back-end-of-line transistors.

In some embodiments, the ferroelectric material of the ferroelectric layers 556 of the ferroelectric tunnel junctions 550 is disposed directly on the crystalline oxide layers 554. In some embodiments, the highly ordered structure of the crystalline oxide layers 554 may have a template effect on the overlying ferroelectric layers 556, enhancing the uniformity of the domains of the ferroelectric material. In some embodiments, the increased uniformity of the domains of the ferroelectric material may reduce the coercive voltage required to switch the ferroelectric domains, thus reducing the power consumption of the semiconductor device 400. In some embodiments, the speed of the semiconductor device 400 may also increase because of shorter wake-up times (the ordering time of the ferroelectric domains). In some embodiments, the enhanced uniformity of the ferroelectric layers 556 may improve the performance of the semiconductor device 400 in terms of process variability and cycling endurance.

Figure 3H:
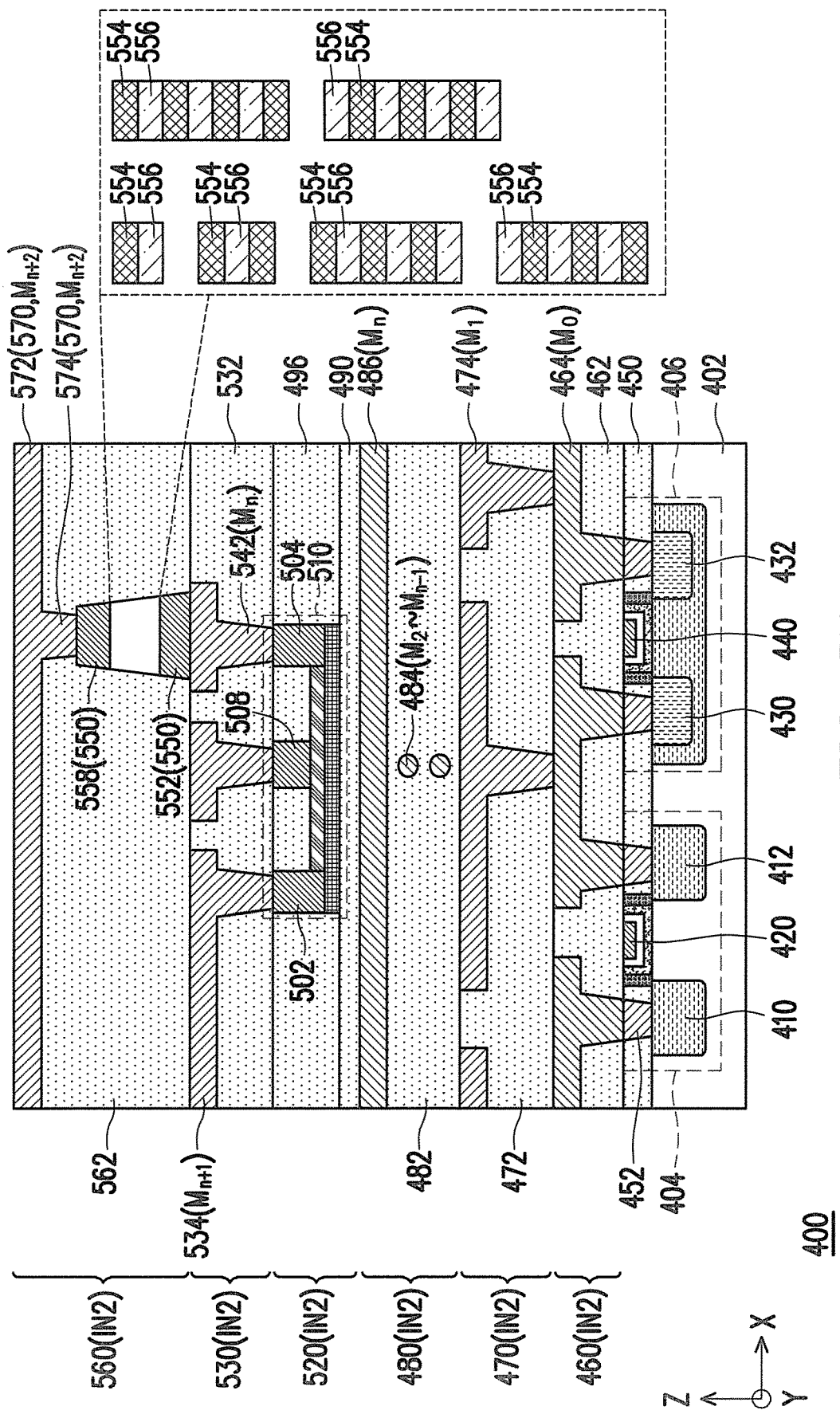
Figure 4A:
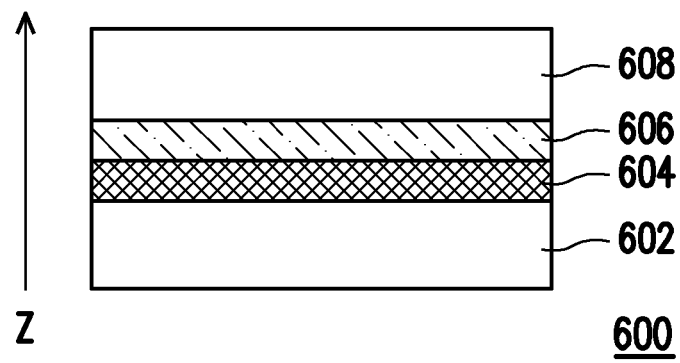
FIG. 4A to FIG. 4G are schematic cross-sectional views of layered structures according to some embodiments of the disclosure.

FIG. 4A to FIG. 4G are schematic cross-sectional views of layered structures according to some embodiments of the disclosures. It should be noted, that while in FIG. 4A to FIG. 4G the layered structures are illustrated with the layers extending substantially flat in a horizontal direction, the disclosure is not limited thereto. In some alternative embodiments, the layers may be bent, for example to be conformally disposed over a substrate. Referring to FIG. 4A, the layered structure 600 includes a base layer 602, a crystalline oxide layer 604, a ferroelectric layer 606 and a cap layer 608 sequentially stacked. In some embodiments, the crystalline oxide layer 604 directly contacts the base layer 602 on one side and the ferroelectric layer 606 on the opposite side. Similarly, the ferroelectric layer 606 directly contacts the crystalline oxide layer 604 on one side and the cap layer 608 on the opposite side. In some embodiments, the crystalline oxide layer 604 includes a crystalline oxide material, similar to what was previously described with reference to the crystalline oxide blanket layer 132a (illustrated, e.g., in FIG. 1C). Similarly, the ferroelectric layer 606 includes a ferroelectric material, similar to what was previously described with reference to the ferroelectric blanket layer 134a (illustrated, e.g., in FIG. 1D). In some embodiments, the highly ordered structure of the crystalline oxide material enhances the uniformity of the domains of the ferroelectric material, improving the performances of the devices including the layered structure 600. In some embodiments, the materials of the base layer 602 and the cap layer 608 are different from both the crystalline oxide material of the crystalline oxide layer 604 and the ferroelectric material of the ferroelectric layer 606, and may be independently selected according to the intended application of the layered structure 600. For example, the materials may be dielectric materials, semiconductor materials, conductive materials (e.g., metallic materials), etc. In some embodiments, the base layer 602 and the cap layer 608 may include the same material. In some alternative embodiments, the base layer 602 and the cap layer 608 may include different materials. For example, when the layered structure 600 is applied as the gate structure 130 of the transistor 140 illustrated in FIG. 1G, the base layer 602 may correspond to the semiconductor material of the channel region 108 and the cap layer 608 may correspond to the gate metal layer 136. When additional layers are included in the gate structure 130, for example a silicon oxide layer (not shown) disposed between the crystalline oxide layer 132 and the channel region 108, the base layer 602 may correspond to such silicon oxide layer, and so on. Similarly, when the layered structure 600 is applied as the ferroelectric tunnel junction 322 of the semiconductor device 200 of FIG. 2I or the ferroelectric tunnel junction 550 of the semiconductor device 400 of FIG. 3G, the base layer 602 may correspond to the bottom electrodes 314, 552, and the cap layer 608 may correspond to the top electrodes 320, 558. The layered structures 610, 620, 630, 640, 650 and 660 of FIG. 4B to FIG. 4G may be applied as the ferroelectric tunnel junction 550 of FIG. 3G, as shown in FIG. 3H.

Figure 4B:
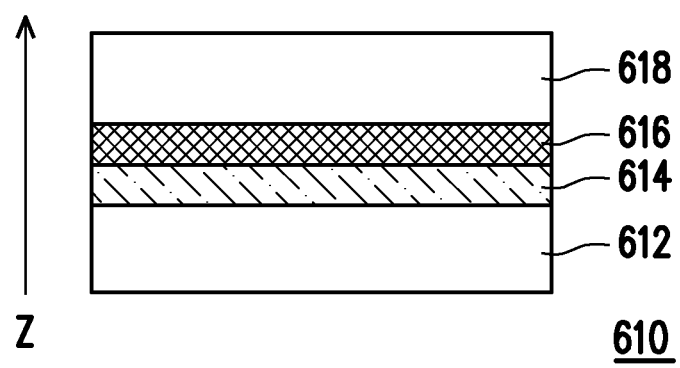

FIG. 4B is a schematic cross-sectional view of a layered structure 610 according to some embodiments of the disclosure. The layered structure 610 includes a base layer 612, a ferroelectric layer 614, a crystalline oxide layer 616, and a cap layer 618 sequentially stacked. In some embodiments, the ferroelectric layer 614 directly contacts the base layer 612 on one side and the crystalline oxide layer 616 on the opposite side. Similarly, the crystalline oxide layer 616 directly contacts the ferroelectric layer 614 on one side and the cap layer 618 on the opposite side. In some embodiments, the crystalline oxide layer 616 includes a crystalline oxide material, similar to what was previously described with reference to the crystalline oxide blanket layer 132a (illustrated, e.g., in FIG. 1C). Similarly, the ferroelectric layer 614 includes a ferroelectric material, similar to what was previously described with reference to the ferroelectric blanket layer 134a (illustrated, e.g., in FIG. 1D). Differently than in the layered structure 600 of FIG. 4A, in the layered structure 610 of FIG. 4B the crystalline oxide layer 616 is formed on top of the ferroelectric layer 614. In such embodiments, a thermal treatment may be performed after formation of the crystalline oxide layer 616 to enhance the uniformity of the domains of the ferroelectric layer 614. For example, the stack of the ferroelectric layer 614 and the crystalline oxide layer 616 may be treated by thermal annealing under reduced pressure. In some embodiments, the pressure may be in the range from $10^{-7}$ to $10^{-10}$ torr. In some embodiments, the annealing temperature is in the range from 250 to 500° C. That is, upon performing the thermal treatment, the highly ordered structure of the crystalline oxide material may enhance the uniformity of the domains of the ferroelectric material, improving the performances of the devices including the layered structure 610. In some embodiments, the materials of the base layer 612 and the cap layer 618 are different from both the crystalline oxide material of the crystalline oxide layer 616 and the ferroelectric material of the ferroelectric layer 614, and may be independently selected according to the intended application of the layered structure 610. For examples, the materials of the base layer 612 and the cap layer 618 may independently be dielectric materials, semiconductor materials, conductive materials (e.g., metallic materials), etc. For example, the layered structure 610 may be applied as ferroelectric tunnel junction in place of the ferroelectric tunnel junctions 322 and 550 of FIG. 2I and FIG. 3G, in which case the base layer 612 and the cap layer 618 may include the conductive materials of the bottom electrodes 314, 552 and top electrodes 320, 558, respectively.

Figure 4C:
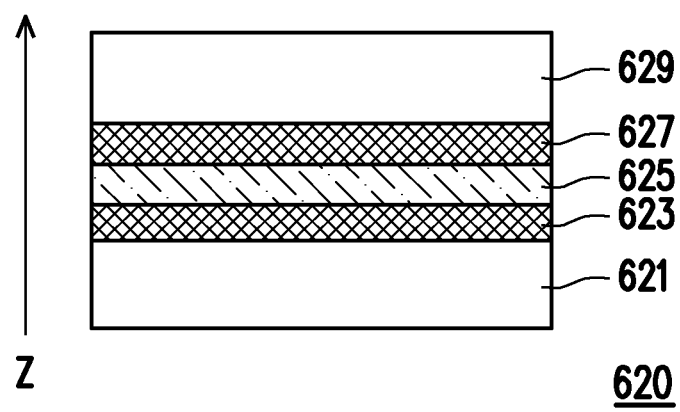

FIG. 4C is a schematic cross-sectional view of a layered structure 620 according to some embodiments of the disclosure. The layered structure 620 includes a base layer 621, a bottom crystalline oxide layer 623, a ferroelectric layer 625, a top crystalline oxide layer 627, and a cap layer 629 sequentially stacked. In some embodiments, the bottom crystalline oxide layer 623 directly contacts the base layer 621 on one side and the ferroelectric layer 625 on an opposite side, while the top crystalline oxide layer 627 directly contacts the ferroelectric layer 625 on one side and the cap layer 629 on an opposite side. The ferroelectric layer 625 is disposed in between the bottom crystalline oxide layer 623, and the top crystalline oxide layer 627, directly contacting the two crystalline oxide layers 623, 627 at opposite sides. In some embodiments, the crystalline oxide layers 623, 627 include a crystalline oxide material, similar to what was previously described with reference to the crystalline oxide blanket layer 132a (illustrated, e.g., in FIG. 1C). Similarly, the ferroelectric layer 625 includes a ferroelectric material, similar to what was previously described with reference to the ferroelectric blanket layer 134a (illustrated, e.g., in FIG. 1D). In the layered structure 620, the ferroelectric layer 625 is sandwiched in between the bottom crystalline oxide layer 623 and the top crystalline oxide layer 627, both of which may have a highly ordered structure. Therefore, in some embodiments, the uniformity of the domains of the ferroelectric material may be enhanced by the crystalline oxide material disposed below the ferroelectric material, as well as by the crystalline oxide material disposed on top of the ferroelectric material. In such embodiments, a thermal treatment similar to what was described above for the layered structure 610 with reference to FIG. 4B may be performed after formation of the top crystalline oxide layer 627. In some embodiments, the enhanced uniformity of the domains of the ferroelectric material improves the performances of the devices including the layered structure 620. In some embodiments, the material of the bottom crystalline oxide layer 623 may differ from the material of the top crystalline oxide layer 627. For example, a first crystalline oxide material may be particularly suitable to enhance the uniformity of the ferroelectric domains when acting as a bottom template in the bottom crystalline oxide layer 623, while a second, different crystalline oxide material may be particularly suitable to enhance the uniformity of the ferroelectric domains when acting as a top template in the top crystalline oxide layer 627. In some embodiments, the materials of the base layer 621 and the cap layer 629 are different from both the crystalline oxide material of the crystalline oxide layers 623, 627 and the ferroelectric material of the ferroelectric layer 625, and may be independently selected according to the intended application of the layered structure 620. In some embodiments, the materials of the base layer 621 and the cap layer 629 may independently be dielectric materials, semiconductor materials, conductive materials (e.g., metallic materials), etc. For example, the layered structure 620 may be applied as ferroelectric tunnel junction in place of the ferroelectric tunnel junctions 322 and 550 of FIG. 2I and FIG. 3G, in which case the base layer 621 and the cap layer 629 may include the conductive materials of the bottom electrodes 314, 552 and top electrodes 320, 558, respectively.

Figure 4D:
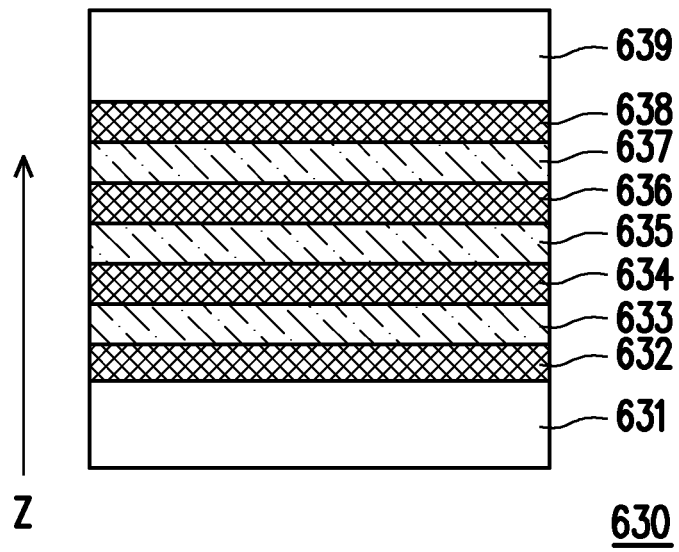

FIG. 4D is a schematic cross-sectional view of a layered structure 630 according to some embodiments of the disclosure. The layered structure 630 includes a base layer 631, a plurality of crystalline oxide layers 632, 634, 636, 638, a plurality of ferroelectric layers 633, 635, 637, and a cap layer 639. The crystalline oxide layers 632, 634, 636, 638 are alternately stacked with the ferroelectric layers 633, 635, 637, so that each ferroelectric layer 633, 635, 637 contacts two of the crystalline oxide layers 632, 634, 636, 638, along a stacking direction. It should be noted that while four crystalline oxide layers 632, 634, 636, 638 and three ferroelectric layers 633, 635, 637 are illustrated in FIG. 4D, the disclosure is not limited thereto. In some alternative embodiments, fewer or more crystalline oxide layers 632, 634, 636, 638 and ferroelectric layers 633, 635, 637 may be included, according to the application requirements. In some embodiments, the bottommost crystalline oxide layer 632 directly contacts the base layer 631 on one side and the bottommost ferroelectric layer 633 on an opposite side, while the topmost crystalline oxide layer 638 directly contacts the topmost ferroelectric layer 637 on one side and the cap layer 639 on an opposite side. In some embodiments, the crystalline oxide layers 632, 634, 636, 638 include a crystalline oxide material, similar to what was previously described with reference to the crystalline oxide blanket layer 132a (illustrated, e.g., in FIG. 1C). Similarly, the ferroelectric layers 633, 635, 637 include a ferroelectric material, similar to what was previously described with reference to the ferroelectric blanket layer 134a (illustrated, e.g., in FIG. 1D). In some embodiments, the materials of individual crystalline oxide layers 632, 634, 636, 638 may be independently selected from each other, so that different crystalline oxide layers 632, 634, 636, 638 may include different crystalline oxide materials. Similarly, the ferroelectric layers 633, 635, 637 may include different ferroelectric materials with respect to each other. In some embodiments, the materials of the crystalline oxide layers 632, 634, 636, 638, and the ferroelectric layers 633, 635, 637 may be independently selected to fine tune the ferroelectric properties of the layered structure 630. In the layered structure 630, all the ferroelectric layers 633, 635, 637 are disposed in direct contact with pairs of crystalline oxide layers 632, 634, 636, 638, which crystalline oxide layers 632, 634, 636, 638 may have a highly ordered structure. Therefore, in some embodiments, the uniformity of the domains of the ferroelectric material may be enhanced by the crystalline oxide material disposed below the ferroelectric material, as well as by the crystalline oxide material disposed on top of the ferroelectric material. In some embodiments, a thermal treatment similar to what was described above for the layered structure 610 with reference to FIG. 4B may be performed so that the crystalline oxide layers 634, 636, 638 disposed on top of a ferroelectric layer 633, 635, or 637 may further enhance the uniformity of the ferroelectric domains of the underlying ferroelectric layer 633, 635, 637. In some embodiments, the enhanced uniformity of the domains of the ferroelectric material improves the performances of the devices including the layered structure 630. In some embodiments, the materials of the base layer 631 and the cap layer 639 are different from both the crystalline oxide material of the crystalline oxide layers 632, 634, 636, 638 and the ferroelectric material of the ferroelectric layer 633, 635, 637, and may be independently selected according to the intended application of the layered structure 630. In some embodiments, the materials of the base layer 631 and the cap layer 639 may independently be dielectric materials, semiconductor materials, conductive materials (e.g., metallic materials), etc. For example, the layered structure 630 may be applied as ferroelectric tunnel junction in place of the ferroelectric tunnel junctions 322 and 550 of FIG. 2I and FIG. 3G, in which case the base layer 631 and the cap layer 639 may include the conductive materials of the bottom electrodes 314, 552 and top electrodes 320, 558, respectively.

Figure 4E:
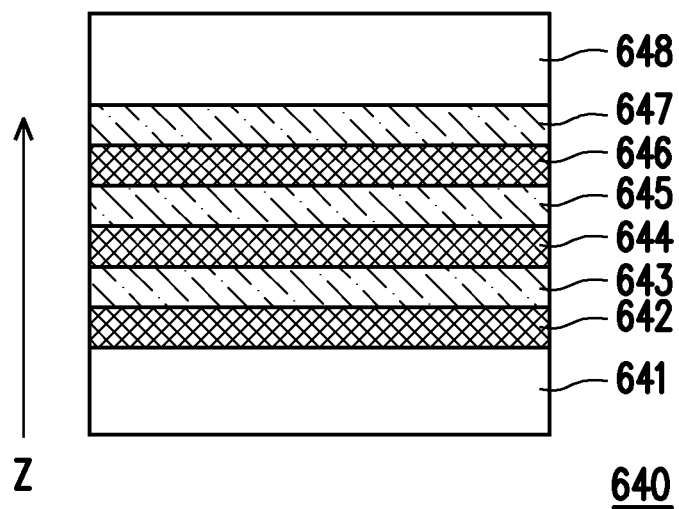

FIG. 4E is a schematic cross-sectional view of a layered structure 640 according to some embodiments of the disclosure. In some embodiments of the disclosure, the layered structure 640 may be similar to the layered structure 630 of FIG. 4D. The layered structure 640 includes a base layer 641, a plurality of crystalline oxide layers 642, 644, 646, a plurality of ferroelectric layers 643, 645, 647, and a cap layer 648. The crystalline oxide layers 642, 644, 646 are alternately stacked with the ferroelectric layers 643, 645, 647 along a stacking direction. In some embodiments, a difference between the layered structure 640 and the layered structure 630 of FIG. 4D lies in that the topmost crystalline oxide layer 646 is sandwiched between and in direct contact with two ferroelectric layers 645, 647, while the topmost ferroelectric layer 647 contacts the topmost crystalline oxide layer 646 on one side and the cap layer 648 at the opposite side. In the layered structure 640, all the ferroelectric layers 643, 645, 647 are disposed in direct contact with at least one of the crystalline oxide layers 642, 644, 646, which crystalline oxide layers 642, 644, 646 may have a highly ordered structure. Therefore, in some embodiments, the uniformity of the domains of the ferroelectric material may be enhanced by the crystalline oxide material disposed below the ferroelectric material, as well as by the crystalline oxide material disposed on top of the ferroelectric material. In some embodiments, a thermal treatment similar to what was described above for the layered structure 610 with reference to FIG. 4B may be performed so that the crystalline oxide layers 644, 646 disposed on top of a ferroelectric layer 643 or 645 may further enhance the uniformity of the ferroelectric domains of the underlying ferroelectric layer 643 or 645. In some embodiments, the enhanced uniformity of the domains of the ferroelectric material improves the performances of the devices including the layered structure 640. In some embodiments, the materials of the base layer 641 and the cap layer 648 are different from both the crystalline oxide material of the crystalline oxide layers 642, 644, 646 and the ferroelectric material of the ferroelectric layer 643, 645, 647, and may be independently selected according to the intended application of the layered structure 640. In some embodiments, the materials of the base layer 641 and the cap layer 648 may independently be dielectric materials, semiconductor materials, conductive materials (e.g., metallic materials), etc. For example, the layered structure 640 may be applied as ferroelectric tunnel junction in place of the ferroelectric tunnel junctions 322 and 550 of FIG. 2I and FIG. 3G, in which case the base layer 641 and the cap layer 648 may include the conductive materials of the bottom electrodes 314, 552 and top electrodes 320, 558, respectively.

Figure 4F:
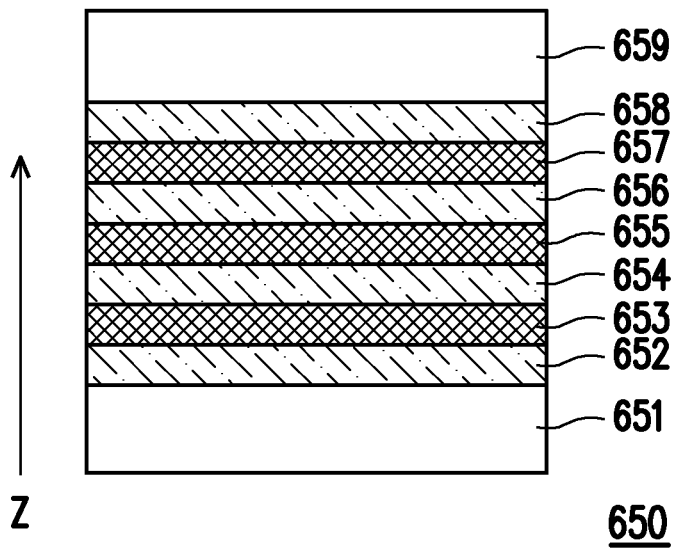

FIG. 4F is a schematic cross-sectional view of a layered structure 650 according to some embodiments of the disclosure. The layered structure 650 includes a base layer 651, a plurality of ferroelectric layers 652, 654, 656, 658, a plurality of crystalline oxide layers 653, 655, 657 and a cap layer 659. The ferroelectric layers 652, 654, 656, 658 are alternately stacked with the crystalline oxide layers 653, 655, 657, so that each ferroelectric layer 652, 654, 656, 658 directly contacts at least one of the crystalline oxide layers 653, 655, 657 along a stacking direction. In some embodiments, each crystalline oxide layer 653, 655, 657 contacts two ferroelectric layers 652, 654, 656, 658 at opposite sides. It should be noted that while four ferroelectric layers 652, 654, 656, 658 and three crystalline oxide layers 653, 655, 657 are illustrated in FIG. 4F, the disclosure is not limited thereto. In some alternative embodiments, fewer or more ferroelectric layers 652, 654, 656, 658 and crystalline oxide layers 653, 655, 657 may be included, according to the application requirements. In some embodiments, the bottommost ferroelectric layer 652 directly contacts the base layer 651 on one side and the bottommost crystalline oxide layer 653 on an opposite side, while the topmost ferroelectric layer 658 directly contacts the topmost crystalline oxide layer 657 on one side and the cap layer 659 on an opposite side. In some embodiments, the crystalline oxide layers 653, 655, 657 include a crystalline oxide material, similar to what was previously described with reference to the crystalline oxide blanket layer 132a (illustrated, e.g., in FIG. 1C). Similarly, the ferroelectric layers 652, 654, 656, 658, include a ferroelectric material, similar to what was previously described with reference to the ferroelectric blanket layer 134a (illustrated, e.g., in FIG. 1D). In some embodiments, the materials of individual crystalline oxide layers 653, 655, 657 and ferroelectric layers 652, 654, 656, 658 may be independently selected, for example to fine tune the ferroelectric properties of the layered structure 650. In some embodiments, the uniformity of the domains of the ferroelectric material may be enhanced by the crystalline oxide material disposed below the ferroelectric material, as well as by the crystalline oxide material disposed on top of the ferroelectric material. In some embodiments, a thermal treatment similar to what was described above for the layered structure 610 with reference to FIG. 4B may be performed so that the crystalline oxide layers 653, 655, 657 disposed on top of a ferroelectric layer 652, 654, or 656 may further enhance the uniformity of the ferroelectric domains of the underlying ferroelectric layer 652, 654, 656. In some embodiments, the enhanced uniformity of the domains of the ferroelectric material improves the performances of the devices including the layered structure 650. In some embodiments, the materials of the base layer 651 and the cap layer 659 are different from both the ferroelectric material of the ferroelectric layers 652, 654, 656, 658 and the crystalline oxide material of the crystalline oxide layers 653, 655, 657, and may be independently selected according to the intended application of the layered structure 650. In some embodiments, the materials of the base layer 651 and the cap layer 659 may independently be dielectric materials, semiconductor materials, conductive materials (e.g., metallic materials), etc. For example, the layered structure 650 may be applied as ferroelectric tunnel junction in place of the ferroelectric tunnel junctions 322 and 550 of FIG. 2I and FIG. 3G, in which case the base layer 651 and the cap layer 659 may include the conductive materials of the bottom electrodes 314, 552 and top electrodes 320, 558, respectively.

Figure 4G:
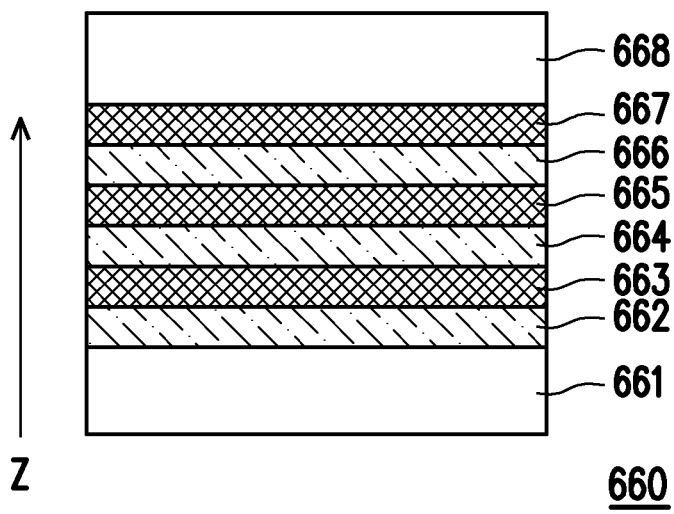

FIG. 4G is a schematic cross-sectional view of a layered structure 660 according to some embodiments of the disclosure. In some embodiments of the disclosure, the layered structure 660 may be similar to the layered structure 650 of FIG. 4F. The layered structure 660 includes a base layer 661, a plurality of ferroelectric layers 662, 664, 666, a plurality of crystalline oxide layers 663, 665, 667, and a cap layer 668. The ferroelectric layers 662, 664, 666 are alternately stacked with the crystalline oxide layers 663, 665, 667 along a stacking direction. In some embodiments, a difference between the layered structure 660 and the layered structure 650 of FIG. 4F lies in that the topmost ferroelectric layer 666 is sandwiched between and in direct contact with two crystalline oxide layers 665, 667, while the topmost crystalline oxide layer 667 contacts the topmost ferroelectric layer 666 on one side and the cap layer 668 at the opposite side. In the layered structure 660, all the ferroelectric layers 662, 664, 666 are disposed in direct contact with at least one of the crystalline oxide layers 663, 665, 667, which crystalline oxide layers 663, 665, 667 may have a highly ordered structure. Therefore, in some embodiments, the uniformity of the domains of the ferroelectric material may be enhanced by the crystalline oxide material disposed below the ferroelectric material, as well as by the crystalline oxide material disposed on top of the ferroelectric material. In some embodiments, a thermal treatment similar to what was described above for the layered structure 610 with reference to FIG. 4B may be performed so that the crystalline oxide layers 663, 665, 667 disposed on top of a ferroelectric layer 662, 664, 666 may further enhance the uniformity of the ferroelectric domains of the underlying ferroelectric layer 662, 664, or 666. In some embodiments, the enhanced uniformity of the domains of the ferroelectric material improves the performances of the devices including the layered structure 660. In some embodiments, the materials of the base layer 661 and the cap layer 668 are different from both the ferroelectric material of the ferroelectric layers 662, 664, 666 and the crystalline oxide material of the crystalline oxide layer 663, 665, 667, and may be independently selected according to the intended application of the layered structure 660. In some embodiments, the materials of the base layer 661 and the cap layer 668 may independently be dielectric materials, semiconductor materials, conductive materials (e.g., metallic materials), etc. For example, the layered structure 660 may be applied as ferroelectric tunnel junction in place of the ferroelectric tunnel junctions 322 and 550 of FIG. 2I and FIG. 3G, in which case the base layer 661 and the cap layer 668 may include the conductive materials of the bottom electrodes 314, 552 and top electrodes 320, 558, respectively.

In accordance with some embodiments of the disclosure, a semiconductor device includes a transistor and a ferroelectric tunnel junction. The ferroelectric tunnel junction is connected to a drain contact of the transistor. The ferroelectric tunnel junction includes a first electrode, a second electrode, a crystalline oxide layer, and a ferroelectric layer. The second electrode is disposed over the first electrode. The crystalline oxide layer and the ferroelectric layer are disposed in direct contact with each other in between the first electrode and the second electrode. The crystalline oxide layer comprises a crystalline oxide material. The ferroelectric layer comprises a ferroelectric material.

In accordance with some embodiments of the disclosure, a field-effect transistor includes a source region, a drain region, a channel region, and a gate structure. The channel region is disposed between the source region and the drain region. The gate structure is disposed on the channel region. The gate structure includes a crystal oxide layer, a ferroelectric layer, and a gate metal layer stacked, in order, on the channel region. The crystal oxide layer includes an oxide having a crystalline structure. The oxide having a crystalline structure includes at least one selected from magnesium oxide, aluminum oxide, and tantalum oxide. The ferroelectric layer includes a ferroelectric material. The ferroelectric material is disposed directly on the oxide having the crystalline structure.

In accordance with some embodiments of the disclosure, a manufacturing method of a semiconductor device includes the following steps. A bottom metallic layer is formed on a conductive pattern of an interconnection structure. A crystalline oxide blanket layer and a ferroelectric blanket layer are formed on the bottom metallic layer. The crystalline oxide blanket layer includes an oxide having a crystalline structure. The ferroelectric blanket layer physically contacts the crystalline oxide blanket layer. The oxide having the crystalline structure of the crystalline oxide blanket layer acts as a template for a ferroelectric material of the ferroelectric blanket layer. A top metallic layer is formed over the crystalline oxide blanket layer and the ferroelectric blanket layer. The stacked bottom metallic layer, the crystalline oxide blanket layer, the ferroelectric blanket layer, and the top metallic layer are patterned to respectively form a bottom electrode, a crystalline oxide layer, a ferroelectric layer, and a top electrode of a ferroelectric tunnel junction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a field-effect transistor, comprising:
      a gate structure disposed on a semiconductor channel of a semiconductor substrate;
      a source region and a drain region disposed in the semiconductor substrate at opposite ends of the semiconductor channel;
      an interlayer dielectric layer disposed on the semiconductor substrate and surrounding the gate structure; and
      a source contact and a drain contact extending through the interlayer dielectric layer to contact the source region and the drain region, wherein top surfaces of the source contact and the drain contact are flushed with a top surface of the gate structure;
a thin film transistor, disposed over and electrically to the field-effect transistor, and comprising:
a semiconductor oxide channel pattern;
a gate pattern disposed over the semiconductor oxide channel pattern;
two metal contacts disposed over the semiconductor oxide channel pattern and beside the gate pattern; and
a high-k dielectric pattern disposed between the gate pattern and the semiconductor oxide channel pattern and in contact with the two metal contacts, wherein the high-k dielectric pattern is disposed only between facing inner sidewalls of the metal contacts, a width of the high-k dielectric pattern is less than a width of the semiconductor oxide channel pattern, and sidewalls of the semiconductor oxide channel pattern are respectively flushed with outer sidewalls of the metal contacts; and
a ferroelectric tunnel junction disposed over and electrically connected to one of the metal contacts of the thin film transistor, wherein the ferroelectric tunnel junction comprises:
a first electrode;
a second electrode, disposed over the first electrode; and
a layered structure comprising at least two crystalline oxide layers and at least two ferroelectric layers disposed alternately and in direct contact with each other between the first electrode and the second electrode, wherein each of the first electrode and the second electrode is TiN, TaN, or a combination thereof, and a bottommost crystalline oxide layer of the layered structure is in direct contact with the first electrode, and wherein a topmost ferroelectric layer of the layered structure is in direct contact with the second electrode.

2. The semiconductor device of claim 1, wherein a top surface of the semiconductor oxide channel pattern is in contact with the high-k dielectric pattern, and a sidewall of the semiconductor oxide channel pattern is in contact with a dielectric material different from the high-k dielectric pattern.

3. The semiconductor device of claim 1, wherein the field-effect transistor further comprising spacers on sidewalls of the gate structure, and top surfaces of the spacers are flushed with then the top surfaces of the source contact and the drain contact.

4. The semiconductor device of claim 1, wherein the adjacent crystalline oxide layer and the ferroelectric layer are in direct contact with each other.

5. The semiconductor device of claim 1, wherein the crystalline oxide layers include the same crystalline oxide material.

6. The semiconductor device of claim 1, wherein the ferroelectric tunnel junction has an inclined sidewall.

7. The semiconductor device of claim 1, wherein the topmost layer is in contact with the second electrode.

8. The semiconductor device of claim 1, wherein the at least one of the crystalline oxide layers has a crystal lattice orientation (110).

9. A semiconductor device, comprising:
a field-effect transistor, comprising:
a gate structure disposed on a semiconductor channel of a semiconductor substrate;
a source region and a drain region disposed in the semiconductor substrate at opposite ends of the semiconductor channel;
an interlayer dielectric layer disposed on the semiconductor substrate and surrounding the gate structure; and
a source contact and a drain contact extending through the interlayer dielectric layer to contact the source region and the drain region, wherein top surfaces of the source contact and the drain contact are flushed with a top surface of the gate structure;
a thin film transistor disposed over and electrically to the field-effect transistor, and comprising a channel pattern comprising a semiconductor oxide; and
a ferroelectric tunnel junction, disposed over and electrically connected to the thin film transistor, wherein the ferroelectric tunnel junction comprises:
a bottom electrode and a top electrode; and
a layered structure, disposed between the bottom electrode and the top electrode and comprising at least two crystalline oxide layers and at least two ferroelectric layers stacked alternately and in direct contact with each other, wherein each ferroelectric layer is hafnium oxide, hafnium zirconium oxide, hafnium lanthanum oxide, hafnium aluminum oxide, or hafnium silicon oxide, and a topmost layer and a bottommost layer are both crystalline oxide layers, wherein each of the bottom electrode and the top electrode is TiN, TaN, or a combination thereof, and the bottommost crystalline oxide layer of the layered structure is in direct contact with the bottom electrode, and wherein a topmost ferroelectric layer of the layered structure is in direct contact with the top electrode.

10. The semiconductor device of claim 9, wherein the topmost layer of the layered structure in contact with the top electrode.

11. The semiconductor device of claim 9, wherein the crystalline oxide layers include the same crystalline oxide material.

12. The semiconductor device of claim 9, wherein the ferroelectric layers have orthorhombic phase.

13. The semiconductor device of claim 9, wherein the ferroelectric tunnel junction has an inclined sidewall.

14. The semiconductor device of claim 9, wherein the at least one crystalline oxide layer has a crystal lattice orientation (110).

15. A semiconductor device, comprising:
a field-effect transistor, comprising:
a gate structure disposed on a semiconductor channel of a semiconductor substrate;
a source region and a drain region disposed in the semiconductor substrate at opposite ends of the semiconductor channel;
an interlayer dielectric layer disposed on the semiconductor substrate and surrounding the gate structure; and
a source contact and a drain contact extending through the interlayer dielectric layer to contact the source region and the drain region, wherein top surfaces of the source contact and the drain contact are flushed with a top surface of the gate structure;
a thin film transistor disposed over and electrically to the field-effect transistor, and comprising:
a channel pattern comprising a semiconductor oxide;
a gate pattern disposed over the channel pattern; and two contacts disposed over the channel pattern and beside the gate pattern, wherein top surfaces of the two contacts are flushed with a top surface of the gate pattern, the high-k dielectric pattern is disposed only between facing inner sidewalls of the contacts, and a width of the high-k dielectric pattern is less than a width of the channel pattern, and sidewalls of the channel pattern are respectively flushed with outer sidewalls of the contacts; and a ferroelectric tunnel junction electrically connected to one of the contacts of the second transistor, wherein the ferroelectric tunnel junction comprises:

a first electrode;

a second electrode, disposed over the first electrode; and a layered structure comprising at least two crystalline oxide layers and at least two ferroelectric layers disposed alternately and in direct contact with each other between the first electrode and the second electrode, wherein each of the first electrode and the second electrode is TiN, TaN, or a combination thereof, and the bottommost crystalline oxide layer of the layered structure is in direct contact with the first electrode, and wherein a topmost ferroelectric layer of the layered structure is in direct contact with the second electrode.

16. The semiconductor device of claim 15, wherein the ferroelectric tunnel junction has an inclined sidewall.

17. The semiconductor device of claim 15, wherein the crystalline oxide layers include the same crystalline oxide material.

18. The semiconductor device of claim 15, wherein the topmost layer is a crystalline oxide layer in direct contact with the second electrode.

19. The semiconductor device of claim 15, wherein the ferroelectric layers have orthorhombic phase.

20. The semiconductor device of claim 15, wherein the ferroelectric layers comprise hafnium zirconium oxide.

* * * * *